US010546929B2

(12) United States Patent
Andrieu et al.

(10) Patent No.: US 10,546,929 B2
(45) Date of Patent: Jan. 28, 2020

(54) OPTIMIZED DOUBLE-GATE TRANSISTORS AND FABRICATING PROCESS

(71) Applicants: COMMISSARIAT A L'ENERGIE ATOMIQUE ET AUX ENERGIES ALTERNATIVES, Paris (FR); STMicroelectronics (Crolles 2) SAS, Crolles (FR)

(72) Inventors: François Andrieu, Saint-Ismier (FR); Remy Berthelon, Saint Martin d'Heres (FR)

(73) Assignees: COMMISSARIAT A L'ENERGIE ATOMIQUE ET AUX ENERGIES ALTERNATIVES, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 16/039,771

(22) Filed: Jul. 19, 2018

(65) Prior Publication Data

US 2019/0027560 A1  Jan. 24, 2019

(30) Foreign Application Priority Data

Jul. 19, 2017  (FR) ..................... 17 56834
Nov. 30, 2017  (FR) ..................... 17 61404

(51) Int. Cl.
*H01L 27/01* (2006.01)
*H01L 29/10* (2006.01)
(Continued)

(52) U.S. Cl.
CPC ........ *H01L 29/1083* (2013.01); *H01L 21/266* (2013.01); *H01L 21/743* (2013.01);
(Continued)

(58) Field of Classification Search
CPC ............ H01L 29/1083; H01L 29/0649; H01L 29/1087; H01L 21/266; H01L 21/743;
(Continued)

(56) References Cited

U.S. PATENT DOCUMENTS 7,732,866 B2 * 6/2010 Cote ................. H01L 21/76264
257/347
9,337,302 B2 * 5/2016 Fenouillet-Beranger ...................
H01L 29/66477
(Continued)

FOREIGN PATENT DOCUMENTS

FR  2 921 751 A1  4/2009
FR  2 986 370 A1  8/2013

OTHER PUBLICATIONS

Andrieu, et al., "Low Leakage and Low Variability Ultra-Thin Body and Buried Oxide (UT2B) SOI Technology for 20nm Low Power CMOS and Beyond", 2010 Symposium on VLSI Technology Digest of Technical Papers, pp. 57-58.
(Continued)

*Primary Examiner* — Tu-Tu V Ho
(74) *Attorney, Agent, or Firm* — Baker & Hostetler LLP

(57) ABSTRACT

An integrated circuit includes a substrate; a buried insulating layer; at least one nMOS transistor comprising a semiconductor layer placed above the buried insulating layer; at least one pMOS transistor comprising a semiconductor layer placed above the buried insulating layer; at least one semiconductor groundplane that may be doped or a metal, placed above the substrate and below the buried insulating layer, said buried plane being common to the nMOS transistor and to the pMOS transistor; at least one gate insulator and a gate that is common to the nMOS transistor and to the pMOS transistor and that is located above the channel of these transistors and facing the groundplane, the area of the groundplane at least covering the area of the gate in vertical
(Continued)

Cross section b projection; the nMOS transistor being separated from the pMOS transistor by an isolation defined between the semiconductor layer of the nMOS transistor and the semiconductor layer of the pMOS transistor, the isolation being located in the buried insulating layer and making contact with the groundplane; at least one shared contact making electrical contact with the common gate and with the common groundplane, the shared contact passing through the buried insulating layer or the isolation.

19 Claims, 40 Drawing Sheets

(51) Int. Cl.
| | | |
|---|---|---|
| H01L 27/12 | (2006.01) | |
| H01L 29/06 | (2006.01) | |
| H01L 21/266 | (2006.01) | |
| H01L 21/8238 | (2006.01) | |
| H01L 21/84 | (2006.01) | |
| H01L 21/74 | (2006.01) | |
| H01L 27/092 | (2006.01) | |

(52) U.S. Cl.
CPC .......... *H01L 21/8238* (2013.01); *H01L 21/84* (2013.01); *H01L 27/1203* (2013.01); *H01L 29/0649* (2013.01); *H01L 29/1087* (2013.01); *H01L 27/092* (2013.01)

(58) Field of Classification Search
CPC ... H01L 21/8238; H01L 21/84; H01L 27/092; H01L 27/1203
USPC ........................................................ 257/351
See application file for complete search history.

(56) References Cited

U.S. PATENT DOCUMENTS

| | | |
|---|---|---|
| 2001/0029067 A1 | 10/2001 | Hirano |
| 2010/0200919 A1 | 8/2010 | Kikuchi |
| 2011/0108943 A1 | 5/2011 | Dennard et al. |
| 2013/0001690 A1 | 1/2013 | Zhu et al. |
| 2017/0018573 A1 | 1/2017 | Zang et al. |

OTHER PUBLICATIONS

Grenouillet, et al., "UTBB FDSOI transistors with dual STI for a multi-Vt strategy at 20nm node and below", 2012 International Electron Devices Meeting.

* cited by examiner

Cross section a

Cross section 2
GP  GP

GP  Cross section 1  GP

Cross section c   Cross section a
GP/caisson
GP  Cross section a and c

Cross section a

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section a

Cross section b

Cross section 2

Cross section 1

Cross section a

Cross section b

Cross section a

Cross section b

Cross section a

Cross section b

Cross section a

Cross section b

Cross section a

Cross section b

Cross section 2

Cross section 1

OPTIMIZED DOUBLE-GATE TRANSISTORS AND FABRICATING PROCESS

CROSS-REFERENCE TO RELATED APPLICATIONS

This application claims priority to foreign French patent applications No. FR 1761404, filed on Nov. 30, 2017, and FR 1756834, filed Jul. 19, 2017, the disclosures of which are incorporated by reference in their entireties.

FIELD OF THE INVENTION

The field of the invention is that of integrated circuits and more precisely that of MOS (for "metal-oxide semiconductor") transistors using FDSOI (for "fully depleted silicon-on-insulator") technology and comprising a biased groundplane placed between a very thin insulating oxide layer and a very thin active layer, commonly called a UTBB (for "ultra-thin body and BOX).

BACKGROUND

It is known that simultaneously biasing the gate of a transistor and its groundplane improves transistor performance, at least in the static regime. The term groundplane generally refers to an isolated n-doped or p-doped region in a semiconductor, it may also be defined by the term well. Such transistors are thus called "double-gate" transistors.

The performance, in terms of current as a function of voltage, obtained with a single-gate transistor and with a double-gate transistor has in particular been described in the article "*Low Leakage and Low Variability Ultra-Thin Body and Buried Oxide (UT2B) SOI Technology for 20 nm Low Power CMOS and Beyond*", F. Andrieu, O. Weber, J. Mazurier, O. Thomas, J-P. Noel, C. Fenouillet-Béranger, J-P. Mazellier, P. Perreau, T. Poiroux, Y. Morand*, T. Morel, S. Allegret*, V. Loup, S. Barnola, F. Martin, J-F. Damlencourt, I. Servin, M. Cassé, X. Garros, O. Rozeau, M-A. Jaud, G. Cibrario, J. Cluzel, A. Toffoli, F. Allain, R. Kies, D. Lafond, V. Delaye, C. Tabone, L. Tosti, L. Brévard, P. Gaud, V. Paruchuri#, K. K. Bourdelle+, W. Schwarzenbach+, O. Bonnin+, B-Y. Nguyen+, B. Doris#, F. Boeuf*, T. Skotnicki*, O. Faynot, CEA-LETI Minatec, 17 rue des Martyrs, 38054 Grenoble Cedex 9, France, ST Microelectronics, 850 rue Monnet, F-38926 Crones; # IBM Research, Albany, N.Y. 12203; + SOITEC, Parc Technologiques des Fontaines F-38926 Bernin, 978-1-4244-7641-1/10/$26.00 ©2010 IEEE 2010 Symposium on VLSI Technology Digest of Technical Papers. FIG. 1 thus shows the performance obtained (the curves "dash: SG mode" relate to a single-gate configuration, and the curves "full: DG mode" relate to a double-gate configuration).

SRAM memories may in particular be improved with this operating mode.

Configurations allowing sets of pMOS and nMOS transistors to be addressed have also been proposed, as in the article: "*UTBB FDSOI transistors with dual STI for a multi-Vt strategy at 20 nm node and below*" L. Grenouillet[1], M. Vinet[1], J. Gimbert[2], B. Giraud[1], J. P. Noël[2], Q. Liu[2], P. Khare[2], M. A. Jaud[1], Y. Le Tiec[1], R. Wacquez[1], T. Levin[3], P. Rivallin[1], S. Holmes[3], S. Liu[3], K. J. Chen[3], O. Rozeau[1], P. Scheiblin[1], E. McLellan[3], M. Malley[3], J. Guilford[3], A. Upham[3], R. Johnson[3], M. Hargrove[4], T. Hook[3], S. Schmitz[3], S. Mehta[3], J. Kuss[3], N. Loubet[2], S. Teehan[3], M. Terrizzi[3], S. Ponoth[3], K. Cheng[3], T. Nagumo[5], A. Khakifirooz[3], F. Monsieur[2], P. Kulkarni[3], R. Conte[3], J. Demarest[3], O. Faynot[1], W. Kleemeier[2], S. Luning[4], B. Doris[3], [1]CEA-LETI, [2]STMicroelectronics, [3]IBM, [4]GLOBALFOUNDRIES, [5]Renesas, 257 Fuller Rd, 12203 Albany, N.Y., USA, 978-1-4673-4871-3/12/$31.00 ©2012 IEEE.

Generally, it is necessary to make provision, in order for the various transistors to operate, to electrically isolate them from one another. For this reason, the transistors are generally encircled by trench isolations that are designated by the acronym STI for "shallow trench isolation". In the article by L. Grenouillet et al., it is proposed, as illustrated in FIG. 4 of this article and reproduced in FIG. 2 of the present patent application, to produce deep STI isolations between the nMOS transistors and the pMOS transistors in order to isolate their wells, and shallow STIs between MOS transistors of the same type, in order to isolate the active (source/drain) regions of the transistors.

SUMMARY OF THE INVENTION

In the present application, a MOS transistor is defined as being the type of insulated-gate field-effect transistor more commonly called a MOSFET (acronym for "metal-oxide-semiconductor field-effect transistor"). The nMOS transistor has an electron channel and the pMOS transistor has a hole channel.

Generally, it is necessary to be able to connect the lower groundplane and the upper gates as illustrated in FIGS. 3a to 3e, which show a set of pMOS transistors and of nMOS transistors and the gate contacts and groundplane contact.

More precisely, FIG. 3a depicts the gate contacts and lower groundplane (GP) contacts, the problem to be addressed remaining that of how to connect the groundplane and the gate without adding a dedicated groundplane contact for each groundplane.

The top view illustrated in FIG. 3a also depicts an active region in which the gates are continuous between the nMOS and pMOS zones, and shows what is called a "hybrid" region with contacts to the substrate.

FIGS. 3b to 3e depict the groundplane used as back gate, it nevertheless being required for the transistors to be biased:
  to be adjacent transistors that have wells of opposite type;
  to have adjacent transistor wells making contact.

The isolation of the wells is therefore achieved with a diode, thereby limiting the biasing range of the wells.

In this context, one subject of the present invention is a configuration of nMOS and pMOS transistors comprising shallow isolation zones between the nMOS transistors and the pMOS transistors, so as to make it possible to use a contact that is shared between the gates (common to the nMOS and pMOS transistors) and the groundplanes or groundlines common to the nMOS transistors and the pMOS transistors.

It will be noted that in prior-art configurations, and in particular in the configurations described in the article by L. Grenouillet et al. (cited above), it is in contrast proposed to use deep STI isolations between the nMOS transistors and the pMOS transistors to isolate their wells, and a shallow STI isolation between MOS transistors of same type to isolate their active regions (defined between the sources and drains of the transistors).

One of the main advantages of the present invention thus resides in the production of a contact shared between gate and groundplane within the double-gate structure.

More precisely, one subject of the present invention is an integrated circuit comprising:
  a substrate;
  a buried insulating layer;

at least one nMOS transistor comprising a semiconductor layer placed above said buried insulating layer;

at least one pMOS transistor comprising a semiconductor layer placed above said buried insulating layer;

at least one semiconductor groundplane that may be doped or a metal groundplane, placed above the substrate and below the buried insulating layer, said buried plane being common to said nMOS transistor and to said pMOS transistor;

at least one gate insulator and a gate that is common to said nMOS transistor and to said pMOS transistor and that is located above the channel of these transistors and facing said groundplane, the area of the groundplane at least covering the area of the gate in vertical projection;

said nMOS transistor being separated from said pMOS transistor by an isolation defined between said semiconductor layer of said nMOS transistor and said semiconductor layer of said pMOS transistor, said isolation being located in said buried insulating layer and making contact with said groundplane;

at least one shared contact making electrical contact with said common gate and with said common groundplane, said shared contact passing through the buried insulating layer or said isolation;

at least one deep isolation region having a lower limit lower than the lower limit of said groundplane on the periphery of said groundplane or of said groundlines, the region located between at least the nMOS transistor and at least the pMOS transistor comprising a shallow isolation region, with a lower limit that is less low than the lower limit of said groundplane or of said groundlines.

Another subject of the invention is an integrated circuit advantageously comprising at least one shared contact making electrical contact with said common gate and with said common groundplane, said shared contact passing through the buried insulating layer or said isolation, said shared contact being asymmetric with respect to said upper gate.

Generally, in the present patent application, when the integrated circuit includes a plurality of nMOS transistors and a plurality of pMOS transistors, the two following cases are envisaged:

the groundplane may be common to a plurality of nMOS transistors and to a plurality of pMOS transistors, the gates having a projection onto the same groundplane;

when the groundplane is of limited extent, it is designated by the term groundline, facing a transistor gate, the gates have a projection facing the groundlines.

According to variants of the invention, said shared contact is located between said nMOS transistor and said pMOS transistor.

According to variants of the invention, the groundplane is defined in a doped semiconductor region referred to as a well, of opposite type to that of said groundplane, said groundplane being doped semiconductor.

According to variants of the invention, the circuit comprises a plurality of nMOS transistors and a plurality of pMOS transistors, said circuit comprising a groundplane common to said plurality of pMOS transistors and to said plurality of nMOS transistors or a plurality of common groundlines between an nMOS transistor and a pMOS transistor, said groundlines facing said common gates and being separated by a dielectric.

It is in particular known that in a logic circuit the source of an nMOS transistor is connected to ground and that of a pMOS transistor is connected to the supply voltage. The fact of not making the groundplane protrude on the side of the drains of the transistors decreases the parasitic capacitance between the groundline and the drain and therefore improves circuit dynamic performance. Drain-side protrusions therefore penalize dynamic performance more then source-side protrusions.

It may therefore be very advantageous to make provision for a circuit configuration in which the groundline does not protrude drain-side.

For this reason, according to variants of the invention, the integrated circuit comprises groundlines that do not protrude in vertical projection with respect to said gates of said nMOS and pMOS transistors on the side of the drains of said nMOS and pMOS transistors.

According to variants of the invention, the circuit comprises groundlines that are off-centered on the side of the sources of said transistors with respect to said gates of said nMOS and pMOS transistors so as not to be facing the drains of said nMOS and pMOS transistors.

According to variants of the invention, the circuit comprises at least two adjacent nMOS transistors and at least two adjacent pMOS transistors, said adjacent nMOS transistors and said adjacent pMOS transistors having a common source between transistors of the same type and a common groundline that is superposed in vertical projection with the gates of said nMOS and pMOS transistors and with the common source.

In such a configuration, it may also be advantageous for said groundline not to protrude in vertical projection with respect to said gates on the side of the drains and said nMOS and pMOS transistors.

According to the present invention, said groundplane is electrically isolated from said substrate and laterally from its environment.

The advantage of the integration of groundlines (corresponding to the smallest possible dimension) is to preserve an overlap with respect to the upper gate, so as to achieve a better electrostatic control while decreasing the extent of the groundplane under the source/drain of the transistor and the parasitic capacitance between the groundplane and the source/drain (capacitance that decreases the dynamic performance (=speed) of the logic gates).

According to variants of the invention, the shared contact comprises a contact (possibly made of tungsten W or of copper Cu) integrated into at least said groundplane or contacts integrated into said groundlines.

According to variants of the invention, the integrated circuit comprises at least one deep isolation region having a lower limit lower than the lower limit of said groundplane on the periphery of said groundplane or of said groundlines, the region located between at least the nMOS transistor and at least the pMOS transistor comprising a shallow isolation region, with a lower limit that is less low than the lower limit of said groundplane or of said groundlines.

Thus, in the present invention, the expression "shallow isolation" defines an isolation that has a depth smaller than the thickness of the insulating layer added to that of the groundplane, allowing the continuity of the groundplane, in the region located between an nMOS transistor and a pMOS transistor, not to be destroyed.

According to variants of the invention, the integrated circuit comprises a plurality of transistors connected to the same groundplane.

According to variants of the invention, the integrated circuit comprises a dielectric, possibly an oxide, located below said groundplane and making contact with the latter and allowing what are called 3D architectures, comprising a plurality of levels, to be produced.

This is achievable in particular in the context of integration of 3D-monolithic or 3D-sequential type, comprising forming metallizations of the bottom level, depositing dielectric then forming metal islands (by lithography/dielectric etching/metal deposition). Said groundplane may cover all of the upper gate and a portion of the source or of the drain. The overlap is relative to the projection of the areas, the area of said groundplane is thus larger than that of the upper gate. The integrated circuit may also comprise at least one lower level comprising at least one transistor located below said dielectric located below said groundplane.

Another subject of the invention is a process for fabricating an integrated circuit according to the invention, comprising:

producing the sources, drains and gates of one or more nMOS transistors and of one or more pMOS transistors;

producing at least one buried groundplane or buried groundlines above the substrate;

producing source and drain contacts of one or more nMOS transistors and of one or more pMOS transistors;

producing one or more shared contacts for making contact with the gates and the groundplane or the gates and the groundlines.

According to variants of the invention, the production of the sources, drains and gates of the transistors is followed by:

depositing a contact etch stop layer (CESL), possibly made of nitride, on the surface of said sources, drains and gates, and a dielectric layer;

producing the source and drain contacts;

successively depositing at least: one contact etch stop layer (CESL), possibly made of nitride, one oxide layer, and one resist layer;

carrying out operations of etching said deposited layers in order to define one or more shared-contact apertures that open onto at least one portion of said gates and onto the groundplane or shared-contact apertures that open onto at least one portion of said gates and of the groundlines;

filling said one or more apertures with at least one electrical conductor in order to define said one or more shared contacts.

According to variants of the invention, the process comprises:

producing the sources, drains and gates of the nMOS and pMOS transistors producing one or more contacts integrated into said groundplane or into said groundlines and one or more primary apertures in the buried insulating layer above said one or more groundplane-integrated contacts;

depositing a layer (CESL) above the sources, drains and gates in said primary aperture;

producing the source and drain contacts;

producing one or more shared contacts on the surface of said one or more integrated contacts.

According to variants of the invention, the process comprises the following steps:

successively depositing at least: one contact etch stop layer (CESL), possibly made of nitride, one oxide layer, and one resist layer;

carrying out operations of etching said deposited layers in order to define one or more shared-contact apertures that open onto at least one portion of the gates and onto the groundplane or shared-contact apertures that open onto the gates and onto the groundlines;

filling said one or more apertures with at least one electrical conductor in order to define the one or more shared contacts.

According to variants of the invention, the process comprises:

producing a groundplane or groundlines by implantation through a mask on the surface of the active semiconductor layers of the nMOS and pMOS transistors, followed by:

producing the sources, drains and gates of at least the nMOS transistor and of at least the pMOS transistor;

producing the source and drain contacts of at least the nMOS transistor and of the pMOS transistor; and producing the shared contacts in order to contact the gate and the groundplane or the gates and the groundlines.

According to variants, the process comprises producing a buried dielectric layer located below said groundplane, allowing 3-D configurations to be produced.

BRIEF DESCRIPTION OF THE DRAWINGS

The invention will be better understood and other advantages will become apparent on reading the following non-limiting description and by virtue of the appended figures, in which.

DETAILED DESCRIPTION

Generally, the integrated circuit of the invention includes:
- at least one nMOS transistor and one pMOS transistor, and advantageously rows of nMOS transistors and rows of pMOS transistors;
- a gate that is common to one nMOS transistor and to one pMOS transistor;
- a groundplane, which may, in certain variants, have a small lateral dimension and correspond to what is defined as a groundline in the present invention;
- a contact that is shared between said gate and said groundplane.

Figure 1:
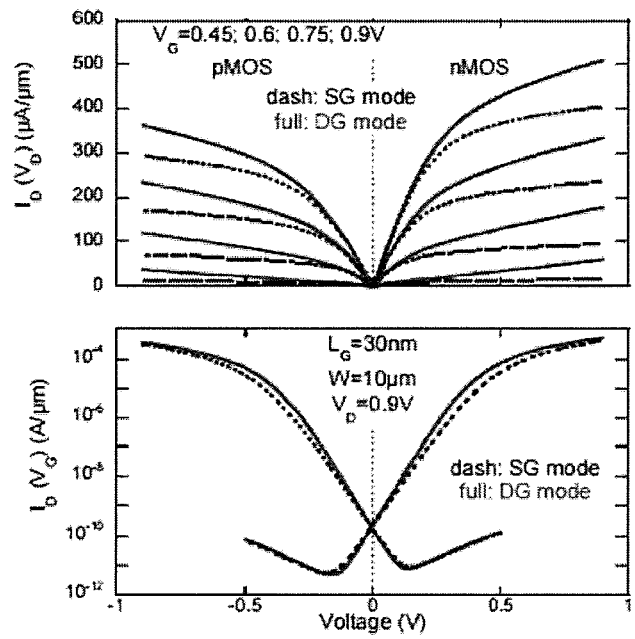
FIG. 1 illustrates the performance, in terms of current as a function of voltage, obtained with a single-gate transistor and with a double-gate transistor according to the prior art.
Figure 2:
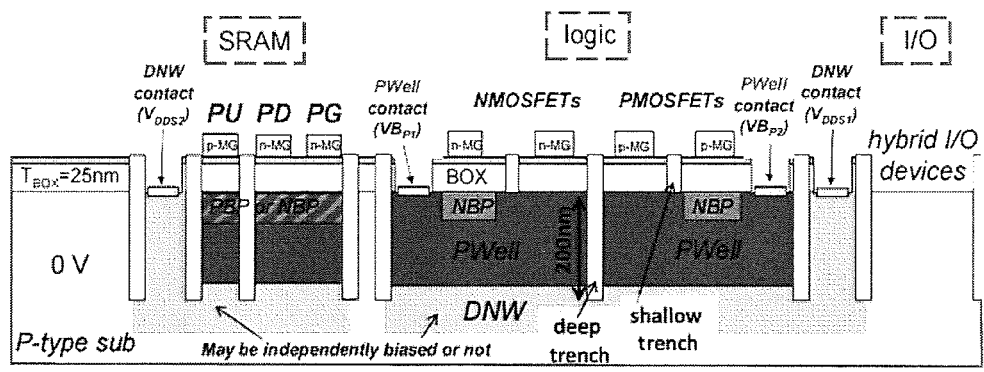
FIG. 2 illustrates a configuration of a set of pMOS and nMOS transistors according to the prior art.
Figure 3A:
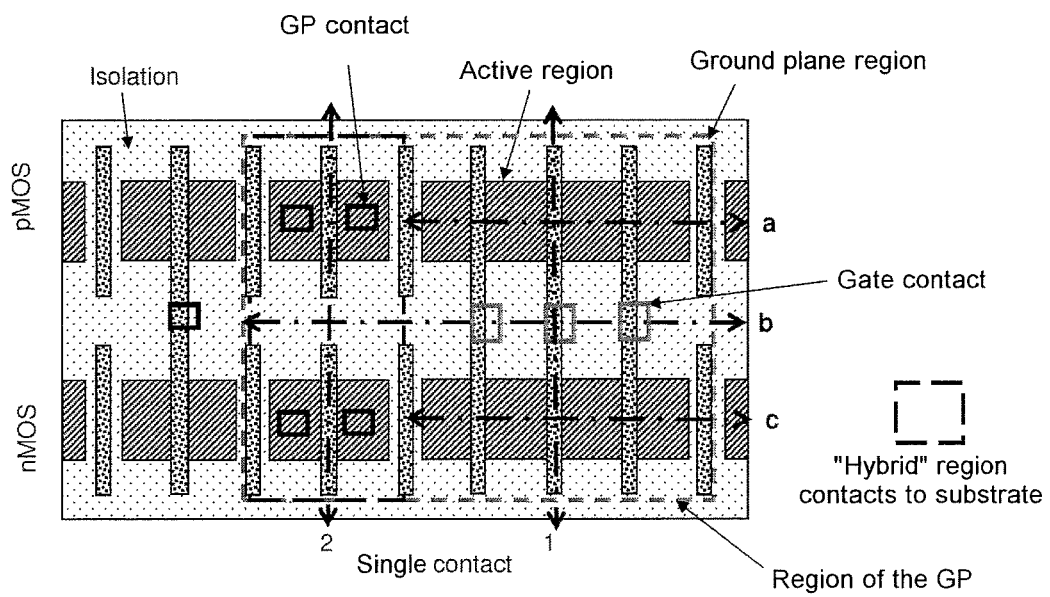
FIGS. 3a to 3e depict the single gate and groundplane contacts in a set of pMOS and nMOS transistors according to the prior art.
Figure 3B:
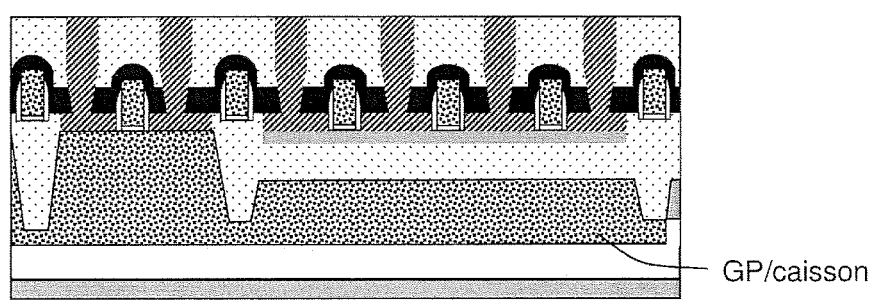
Figure 3C:
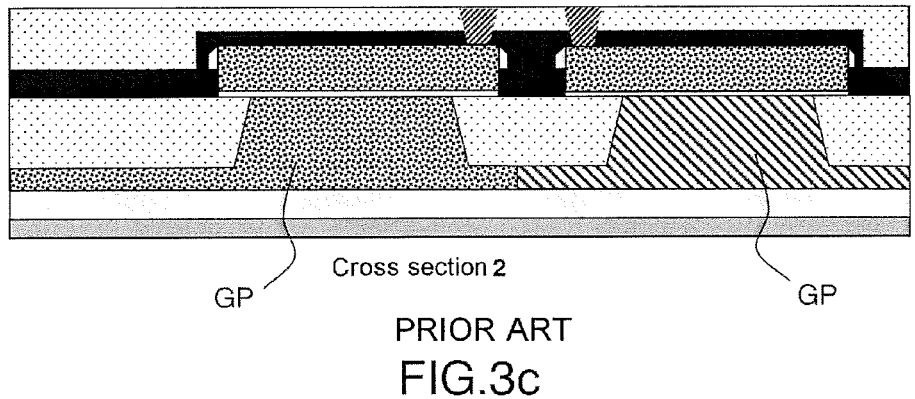
Figure 3D:
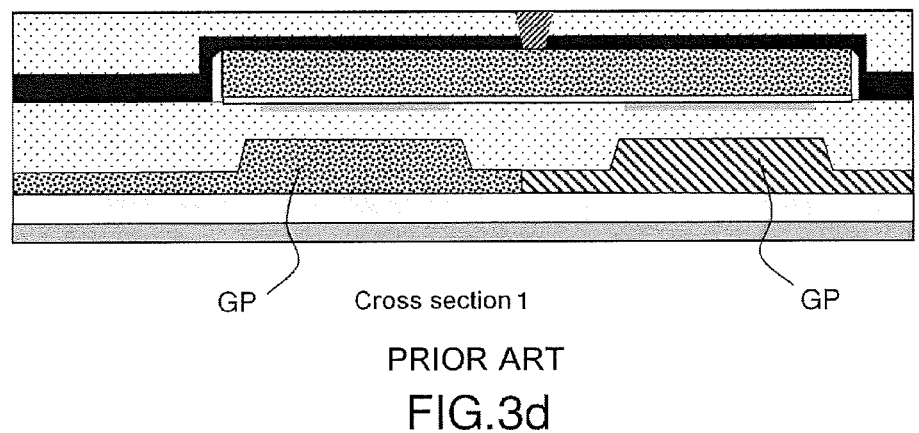
Figure 3E:
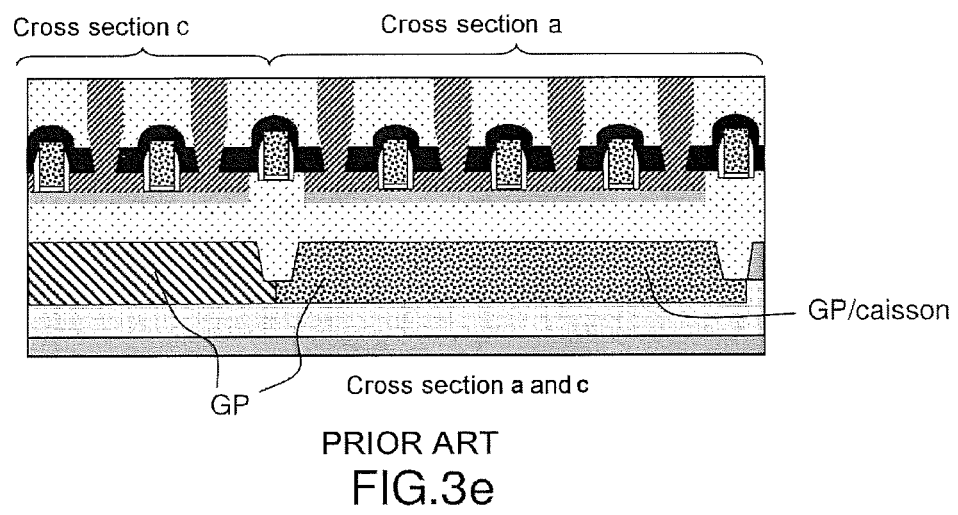
Figure 4A:
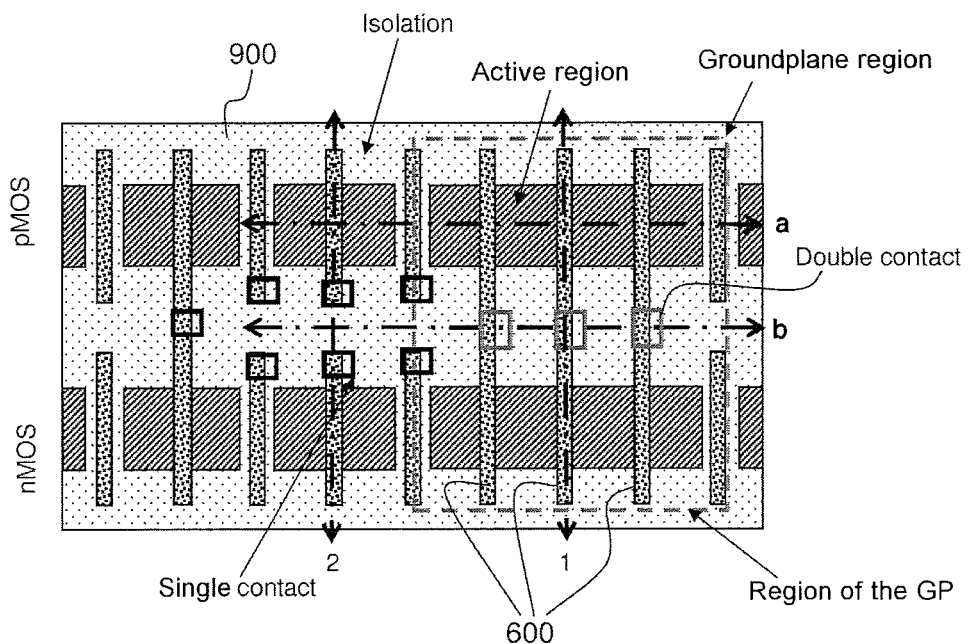
FIGS. 4a to 4e illustrate a first example of a set of pMOS and nMOS transistors according to the invention.

First example of an integrated circuit according to the invention:

The integrated circuit includes on a semiconductor substrate, which may be made of silicon, a row of nMOS transistors and a row of pMOS transistors. A region, called the active region, including a groundplane, which is shown in FIG. 4a, is defined. An nMOS transistor includes a gate that is common with a pMOS transistor. In this example, the three gates circumscribed in the region called the groundplane region may be connected to the same potential.

More precisely, and as illustrated in FIGS. 4a to 4e, this example of a circuit comprises, on the surface of a semiconductor substrate 100:
- a buried layer 101 (which may be optional) of doped semiconductor (possibly for example with a thickness of about 100 nm);
- a well 201 made of doped semiconductor;
- a groundplane 200 made of doped semiconductor, the doping of the well may be of opposite type to that of the groundplane, so as to allow the latter to be electrically isolated with a reverse-biased diode (the dopant concentration may for example be about $10^{16}$-$10^{18}$ at/cm$^3$ and possibly have a thickness of about 20 nm);
- a dielectric layer, possibly a buried oxide 300, i.e. what is commonly called a BOX (and possibly for example of 25 nm thickness);
- a semiconductor layer, 400, called the active layer, from which the source and drain are produced, possibly having a thickness of about 7 nm, generally with an upper layer 401 possibly formed by silicidation (formation for example of NiSi);
- to produce the gates of the transistors: a gate metal 600 possibly having a thickness of about 40 nm thickness, gate oxides 501 and spacers 502;
- source and drain contacts 701 and 702;
- a contact etch stop layer (CESL) 800 for the source and drain contacts;
- an upper dielectric 900, possibly an oxide.

FIGS. 4a (top view), 4b (cross-sectional view a), 4c (cross-sectional view b), 4d (cross-sectional view 2: the contacts 704 and 705 correspond to single contacts: gate contacts of nMOS and pMOS transistors in a region other than the region called the active region) 4e (cross-sectional view 1), allow the shared contact 703 common to the gate and to the groundplane to be seen. These figures, and in particular FIG. 4e, also show that the integrated circuit comprises a shallow isolation STI$_1$, between the nMOS transistor and the pMOS transistor, said isolation being produced between the two active layers of the transistors, above a continuity of the groundplane.

Second Example of an Integrated Circuit According to the Invention:

This example of an integrated circuit is similar to the aforementioned first example and furthermore comprises what are called deep isolations STI$_2$ (possibly having a thickness larger than or equal to the thickness of the BOX layer+the thickness of the groundplane) on the periphery of the groundplane as illustrated by virtue of FIGS. 5a to 5e. In these figures, elements that are the same as in FIGS. 4a to 4e have been referenced with the same references as in FIGS. 4a to 4e.

Figure 5A:
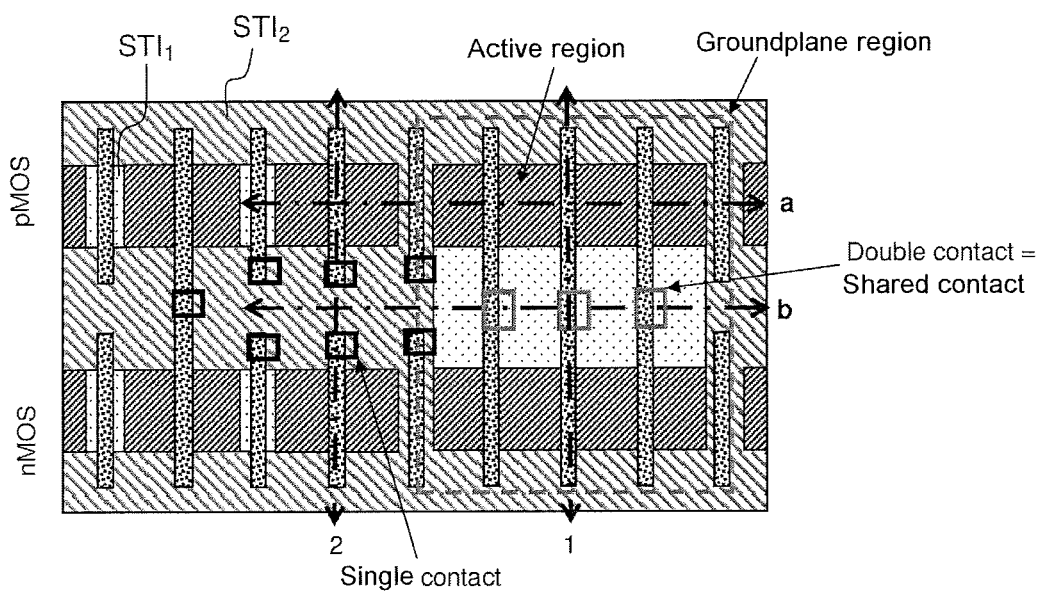
FIGS. 5a to 5e illustrate a second example of a set of pMOS and nMOS transistors according to the invention.
Figure 5B:
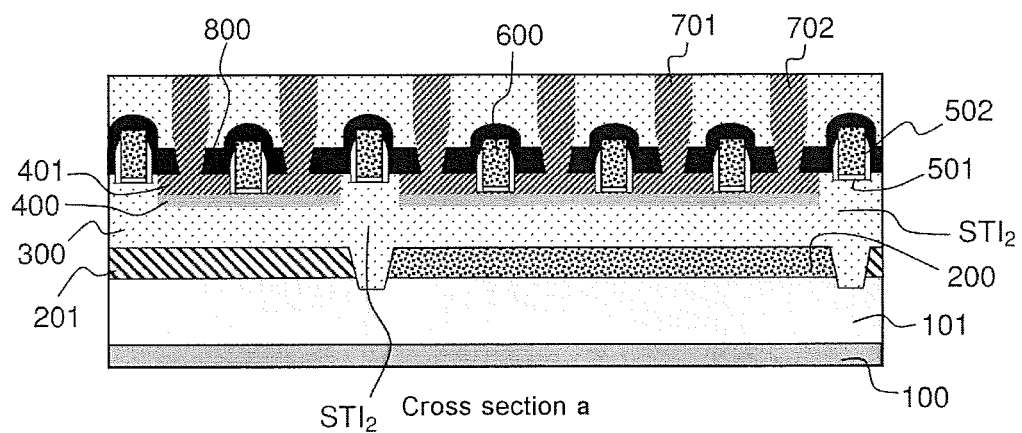
Figure 5C:
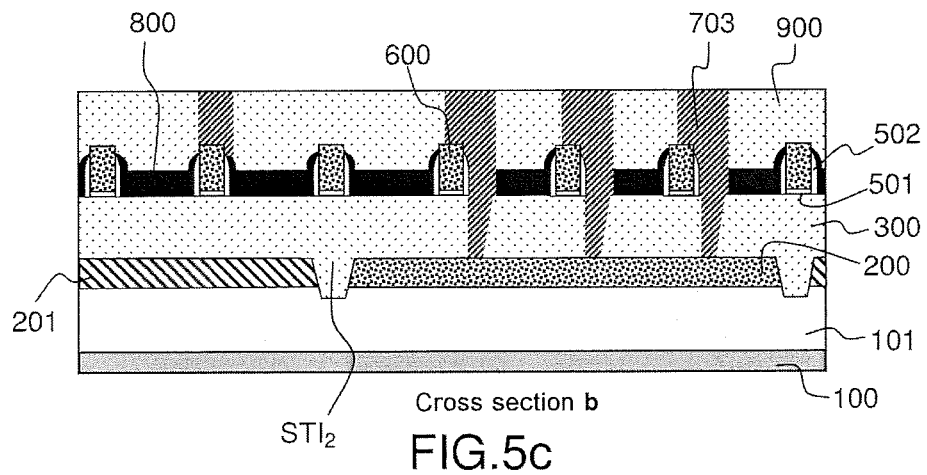
Figure 5D:
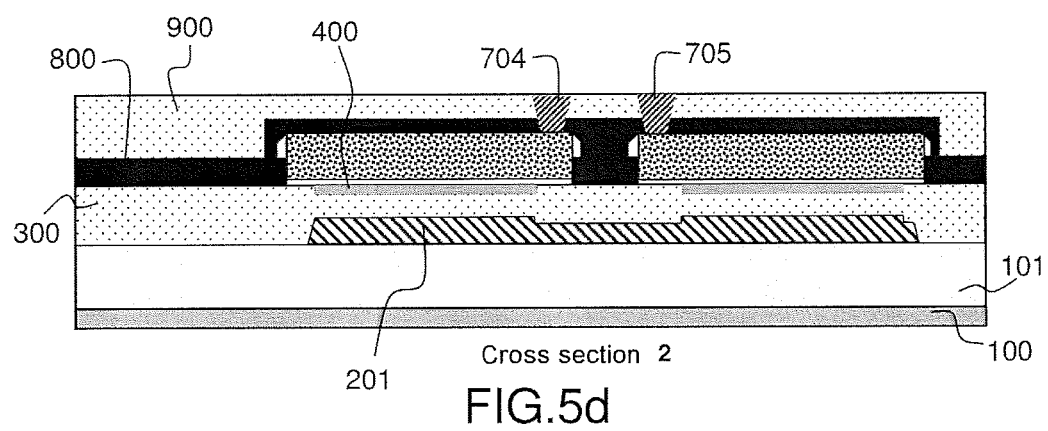
Figure 5E:
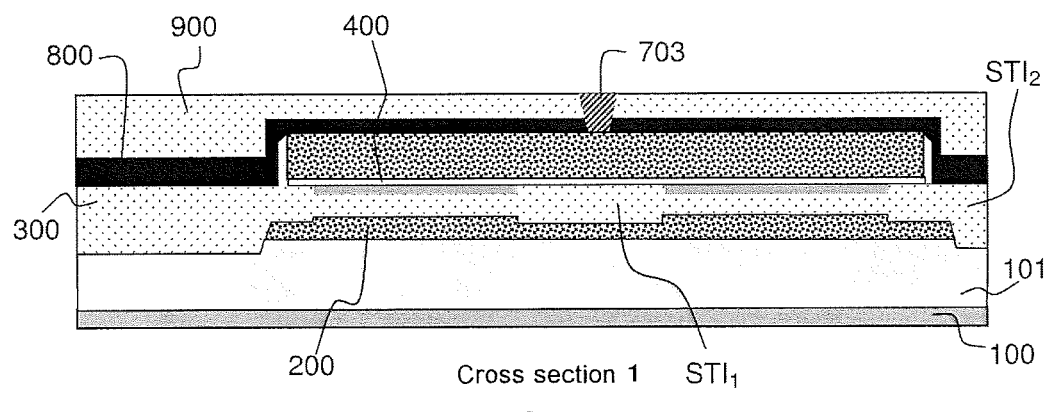

FIGS. 5a (top view), 5b (cross-sectional view a), 5c (cross-sectional view b), 5d (cross-sectional view 2), 5e (cross-sectional view 1) allow the shared contact 703 common to the gate and to the groundplane to be seen. These figures, and in particular FIGS. 5a and 5e, also show that the integrated circuit comprises a shallow isolation STI$_1$ between the nMOS transistor and the pMOS transistor, said isolation being produced between the two active layers of the transistors, above a continuity of the groundplane; and a deep isolation STI$_2$ on the periphery. The advantage of this example is that the groundplanes are isolated laterally by the deep isolations STI$_2$ and not by diodes (as in the preceding examples); this improves the isolation and broadens the possible biasing ranges.

Figure 4B:
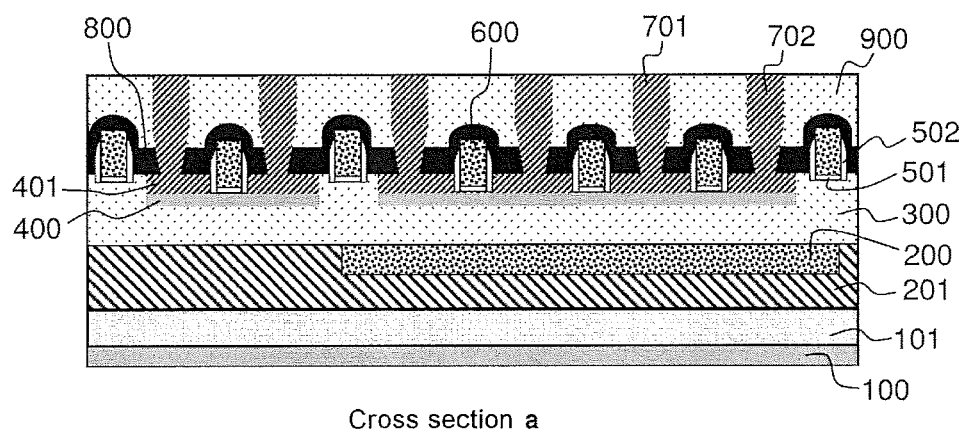
Figure 4C:
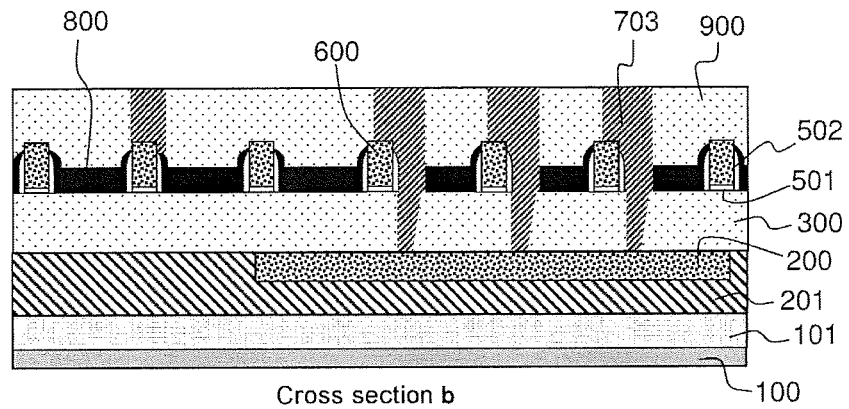
Figure 4D:
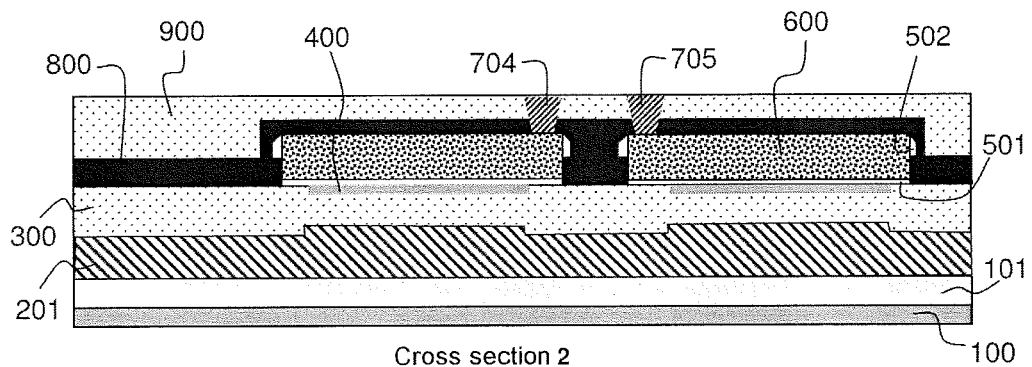
Figure 4E:
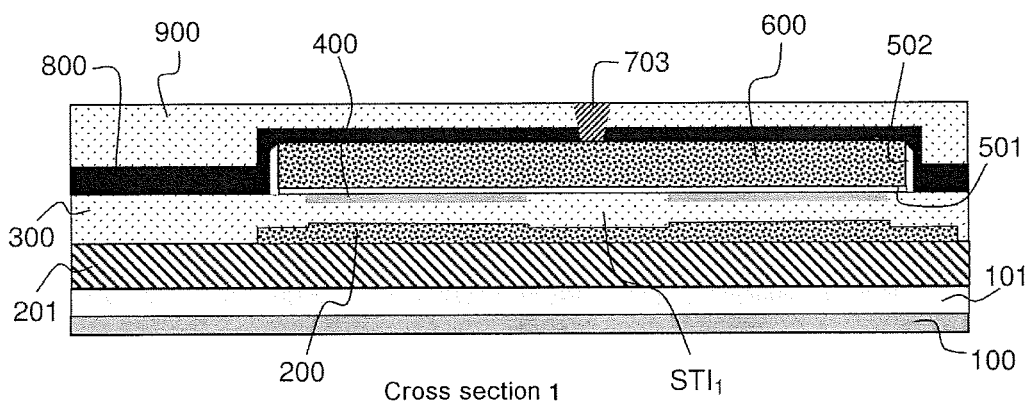

First example of a Process for Fabricating a Circuit According to the Described-Above First Example of a Circuit of the Invention:

The process, the main steps of which are described below, has a configuration that is in particular illustrated by the cross-sectional views a and b shown in FIG. 6a, and which show equivalent views to those illustrated in FIG. 4b and in FIG. 4c.

Figure 6A:
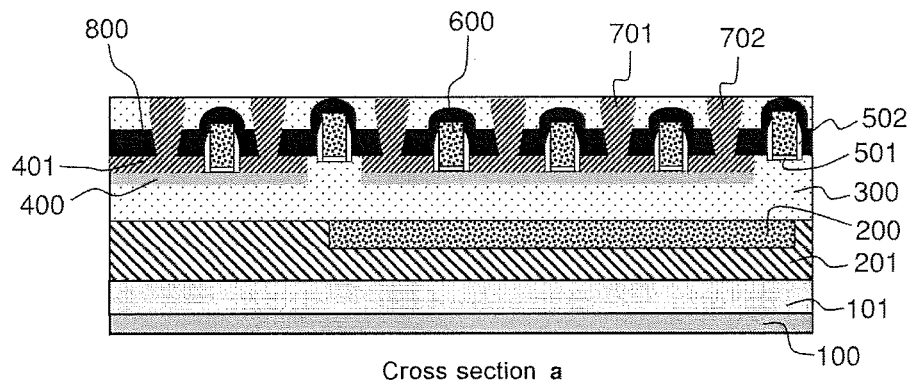
FIGS. 6a to 6j illustrate the steps of a first process for fabricating an example of a circuit comprising a set of pMOS and nMOS transistors according to the invention.
Figure 6A:
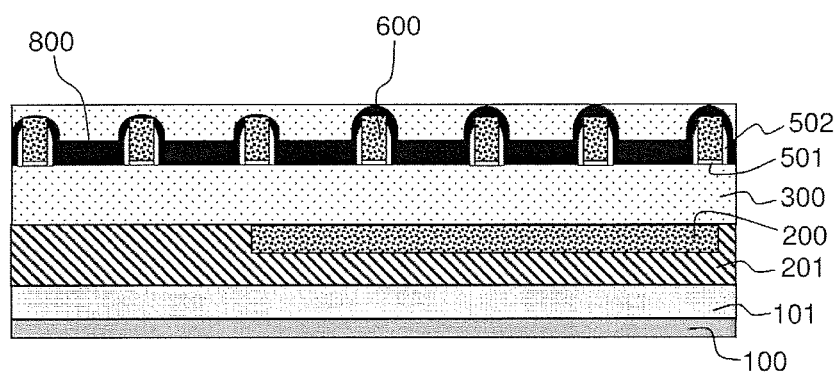

The following are produced in a known way in/on a silicon substrate:
- (STI or mesa) isolations, which are illustrated in FIG. 6a;
- channel implantations, groundplane implantations 200 and well implantations 201 on the surface of a layer 101;
- the gate structure with the metal 600;
- sources and drains in the layers 401;
- source contacts 701 and drain contacts 702 in the active zone;
- the deposit of a dielectric layer 900.

Figure 6B:
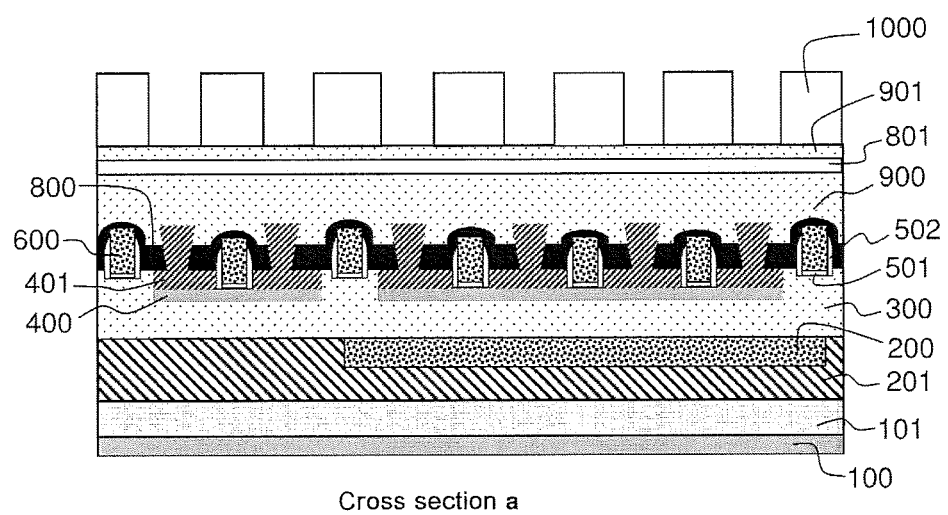
Figure 6B:
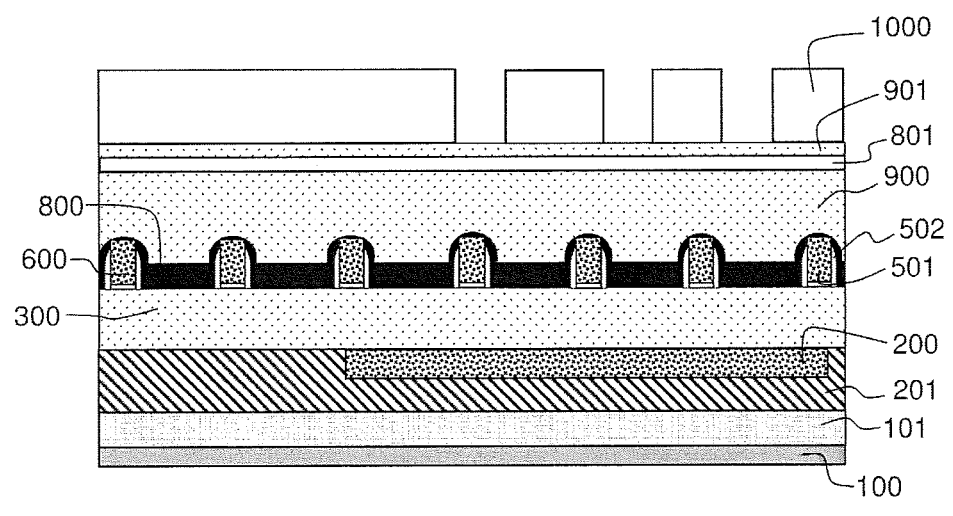

Next, the deposition of a nitride deposit 801 and an oxide deposit 901, and then a resist deposit 1000 is carried out, in which deposition etching patterns are produced via photolithography operations as illustrated in FIG. 6b.

Figure 6C:
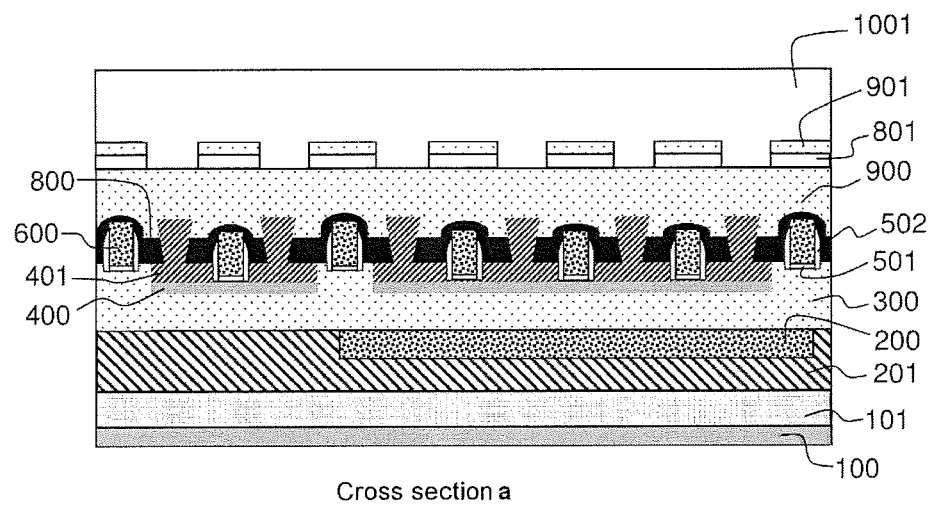
Figure 6C:
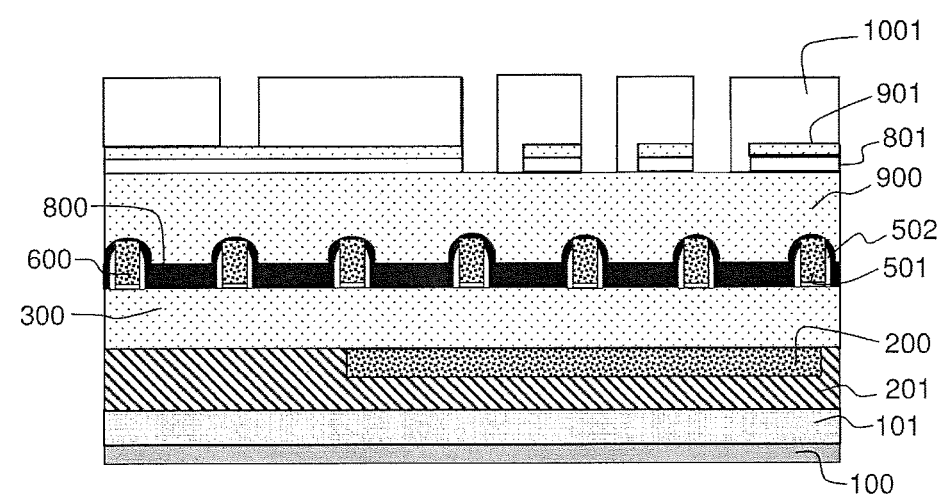

Next, a new resist deposit 1001 is formed and local operations of etching the layers 801 and 901 are carried out as illustrated in FIG. 6c.

Figure 6D:
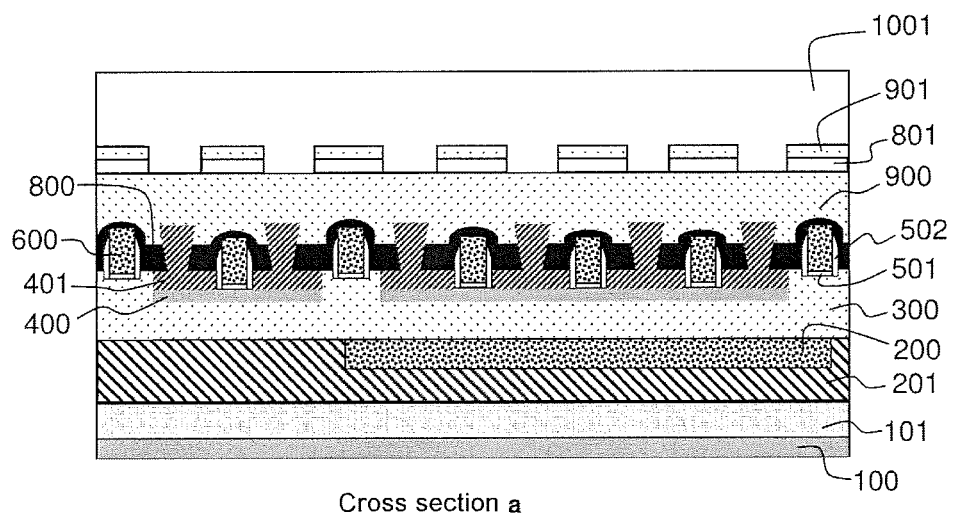
Figure 6D:
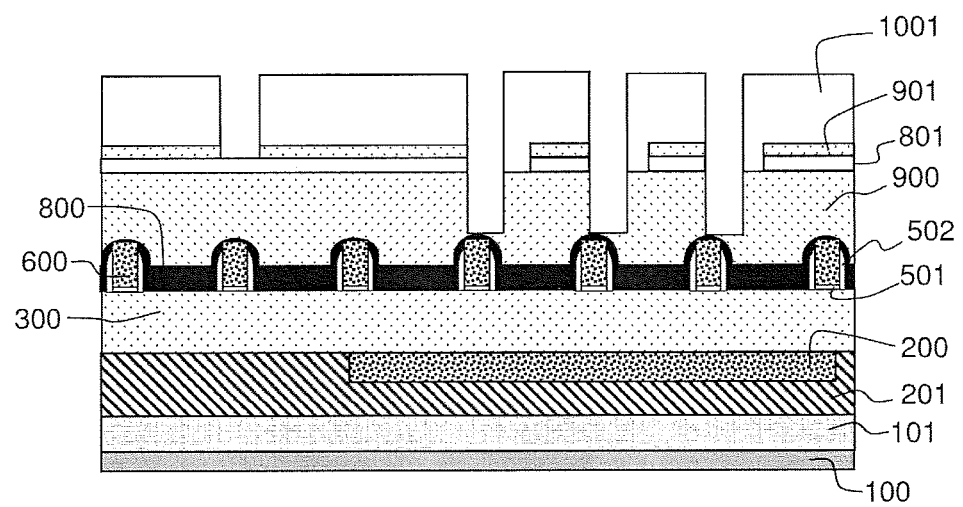

An operation of locally etching the oxide layer 900, which is located above the gates 600, is then carried out, as illustrated in FIG. 6d.

Figure 6E:
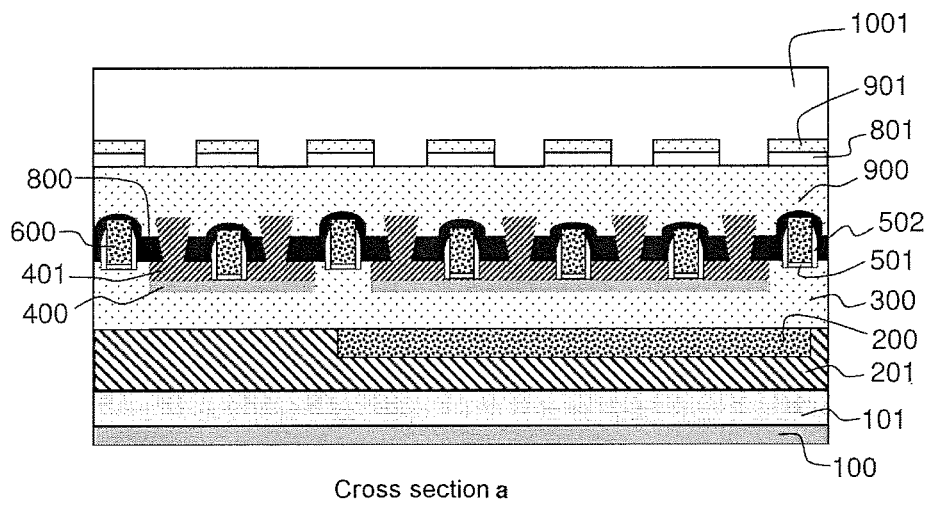
Figure 6E:
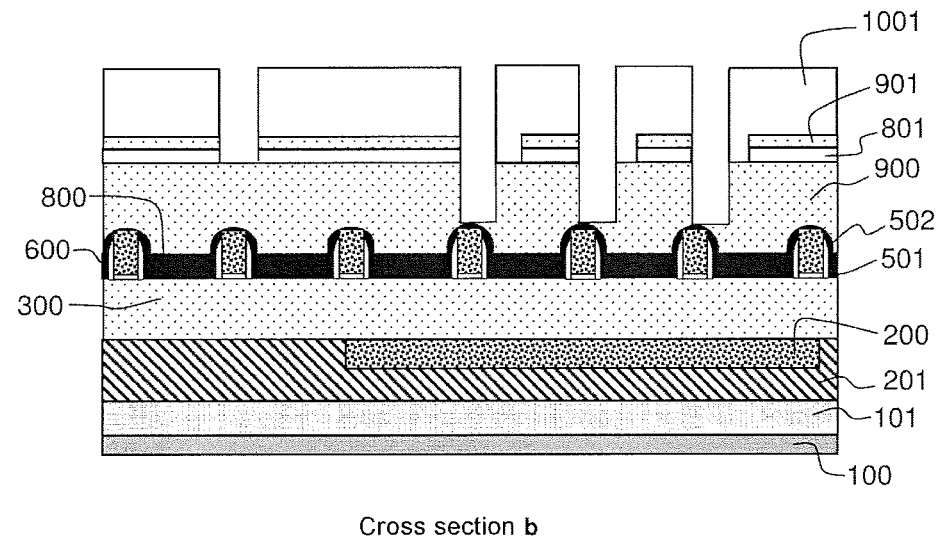

Next, the nitride layer 801 is etched, as illustrated in FIG. 6e.

Figure 6F:
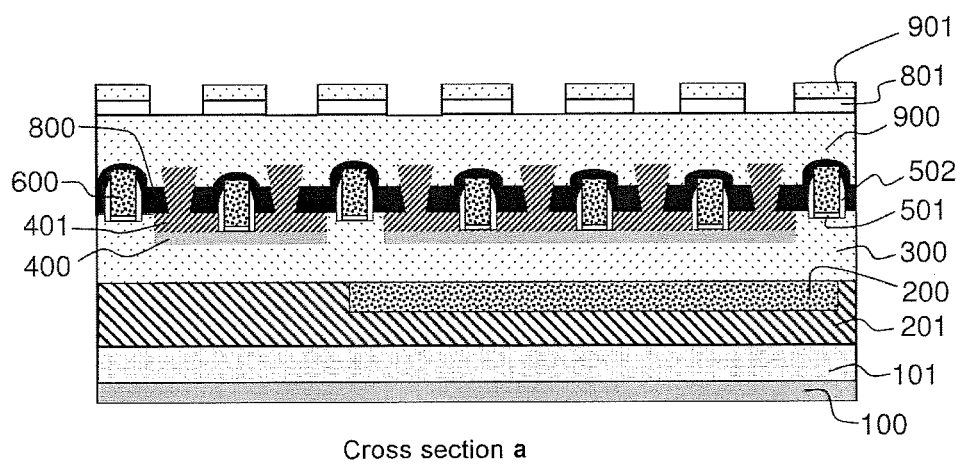
Figure 6F:
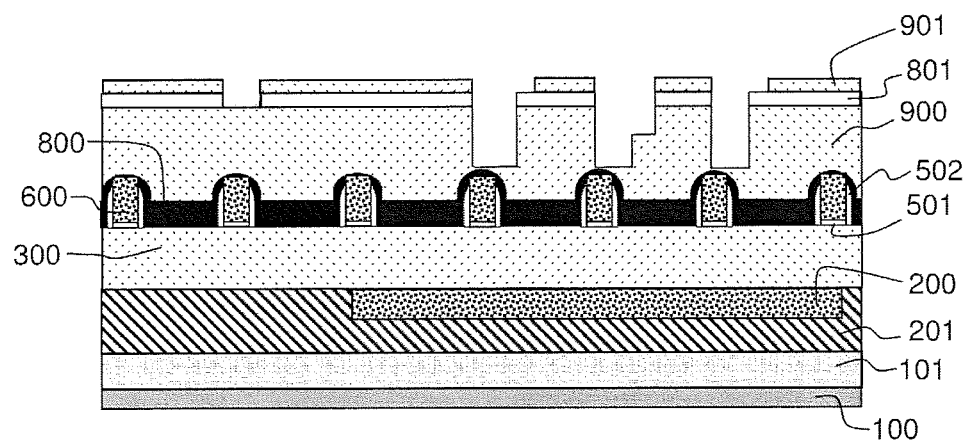

Next, the resist layer 1001 is removed by etching, as illustrated in FIG. 6f.

Figure 6G:
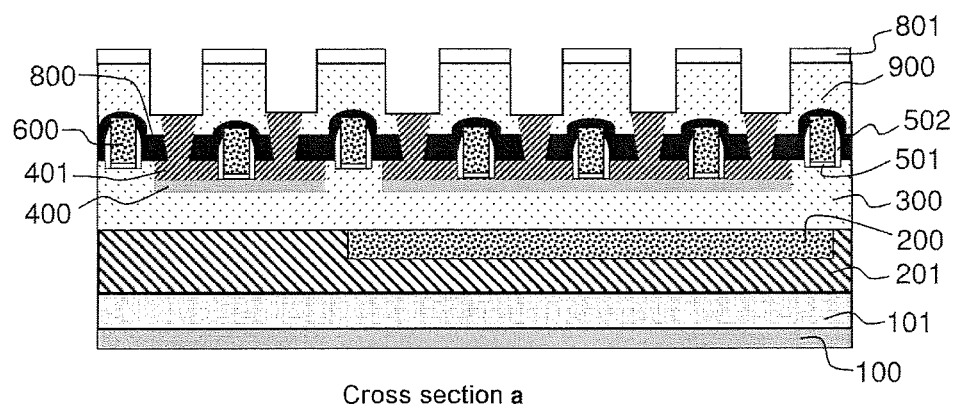
Figure 6G:
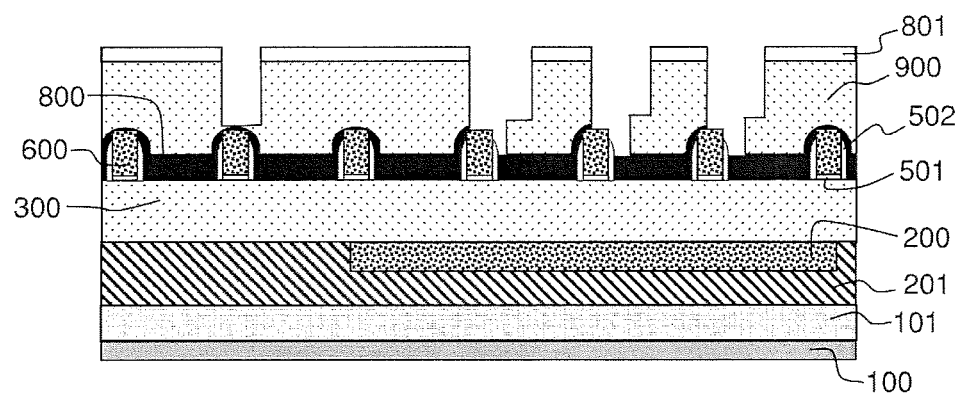

Next, a new operation of locally etching the upper dielectric layer 900 is carried out in order to define the layout of the shared contacts as illustrated in FIG. 6g.

Figure 6H:
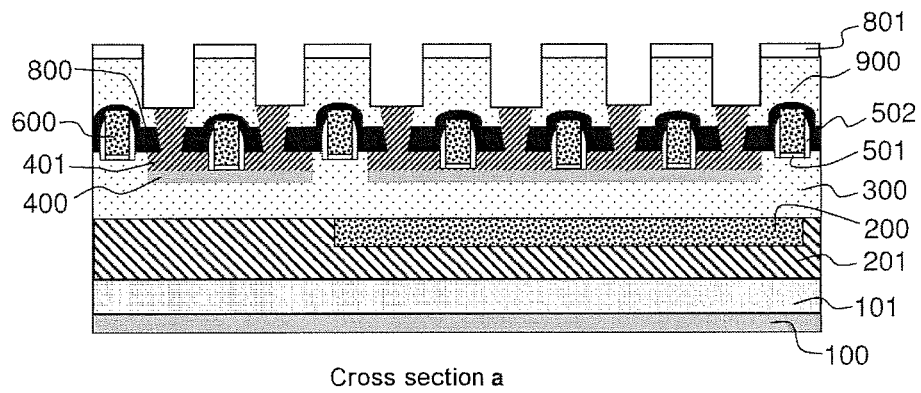
Figure 6H:
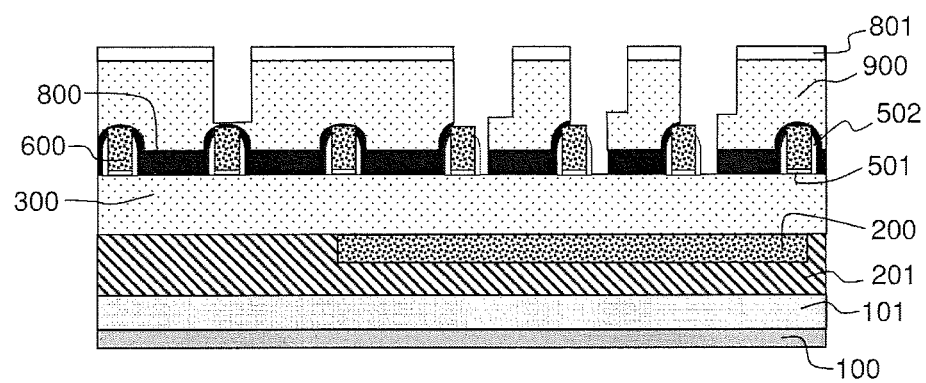

Next an operation of locally etching the nitride layer 800 level with the gates is carried out, as illustrated in FIG. 6h.

It will be noted that the thickness of the upper nitride layer 801 is larger than the thickness of the lower nitride layer 800.

Figure 6I:
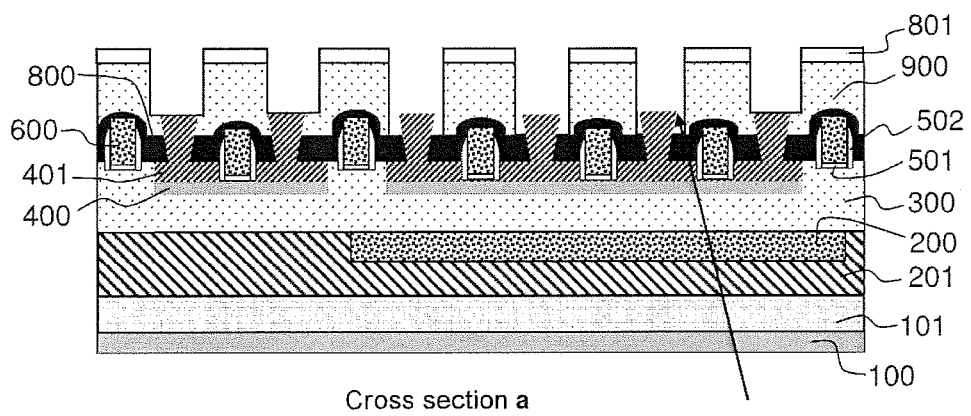
Figure 6I:
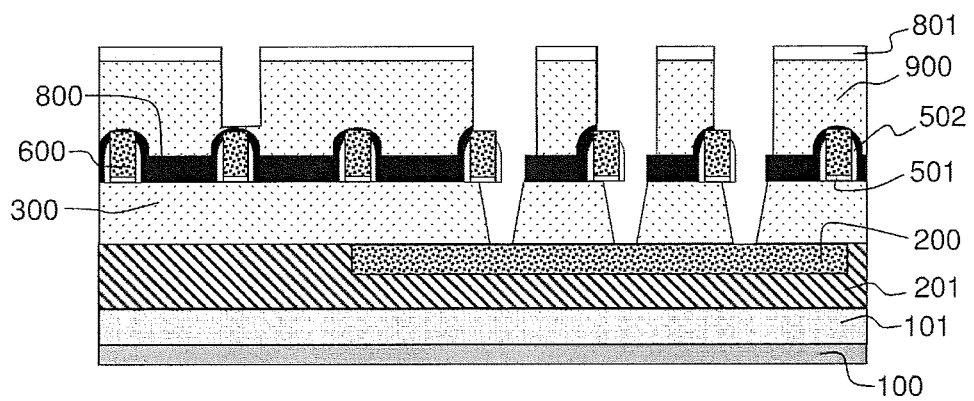

Next, the BOX buried oxide layer 300 is also etched in order to finish the aperture intended for the production of the shared contact, as illustrated in FIG. 6i. A zone of over etching of the oxide above the source/drain is indicated by an arrow, this over etching is disadvantageous and therefore to be minimized.

Figure 6J:
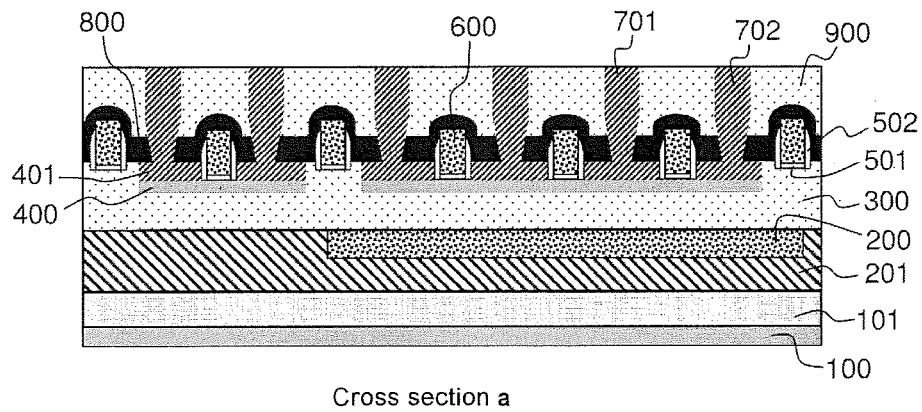
Figure 6J:
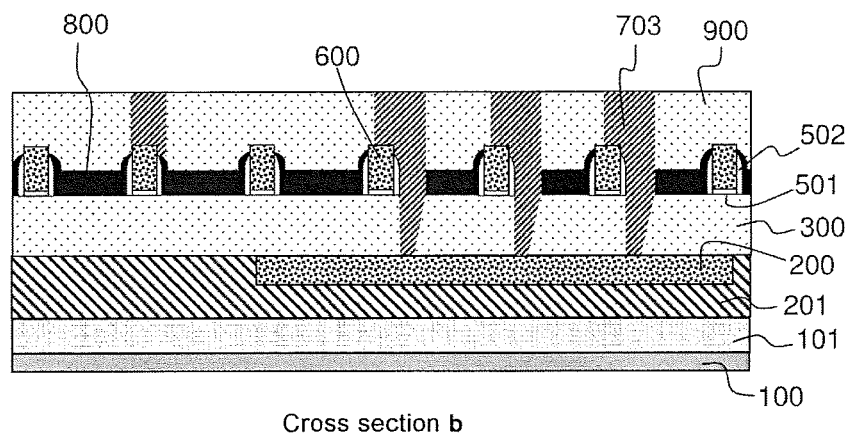

Lastly, the shared contacts are produced by filling the apertures, for example with tungsten, followed by a CMP (chemical-mechanical polishing) operation in order to finish said contacts, as illustrated in FIG. 6j. Thus the source and drain contacts 701, 702, and the shared gate and groundplane contacts 703 are obtained.

Second Example of a Process for Fabricating a Circuit According to the Invention The first steps are identical to the first processing steps described in the first process example, i.e. the steps recalled below:

The following are produced in a known way in/on a silicon substrate 100:
 (STI or mesa) isolations;
 channel implantations, groundplane implantations 200 and well implantations 201 on the surface of a layer 101;
 the gate structure with the metal 600.

Figure 7A:
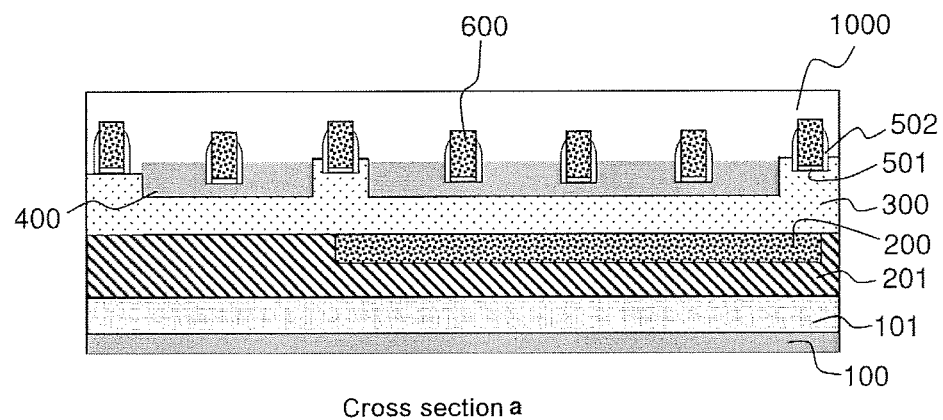
FIGS. 7a to 7k illustrate the steps of a second process for fabricating an example of a circuit comprising a set of pMOS and nMOS transistors according to the invention.
Figure 7A:
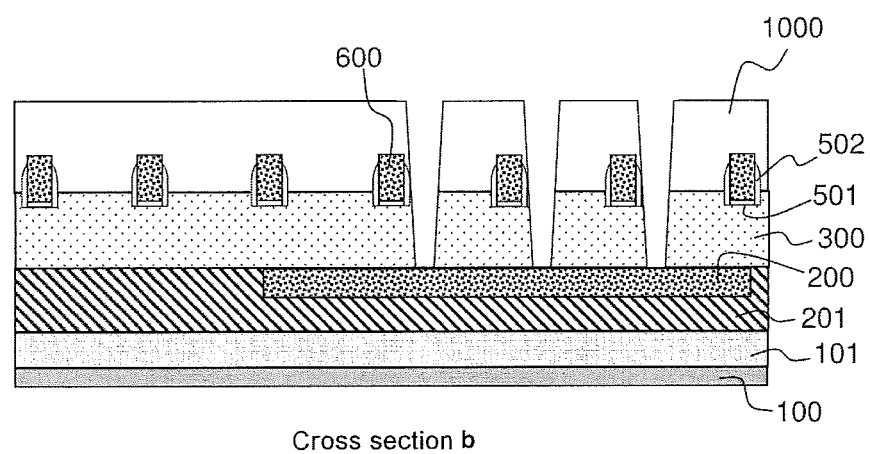

Next a resist layer 1000 is deposited and a photolithography/etching operation is carried out to define, upstream, apertures intended for the shared (gate/groundplane) contacts, as illustrated in FIG. 7a, which illustrates the cross sections a and b of the structure described here.

Figure 7B:
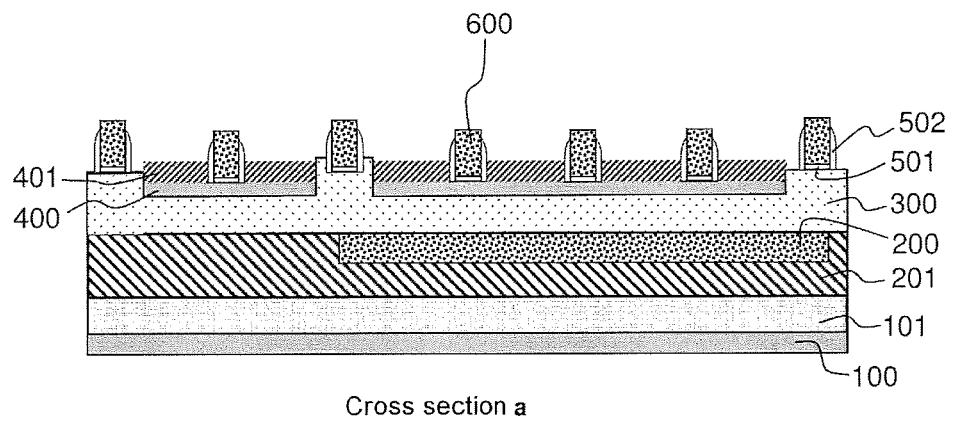
Figure 7B:
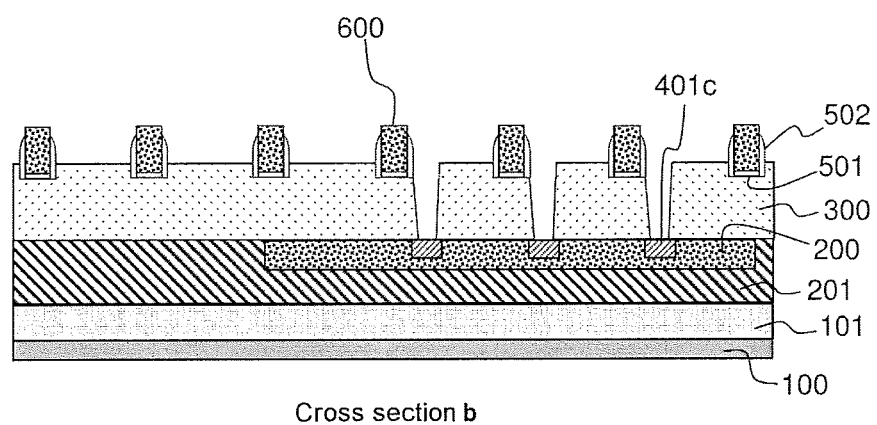

Next, an operation of etching the resist 1000 is carried out, then an operation, for example of forming a silicide 401 (for example formation of NiSi), is carried out, the latter operation being intended to define the source and drain contacts, and integrated contacts 401c intended to form part of the shared contacts, as illustrated in FIG. 7b.

Figure 7C:
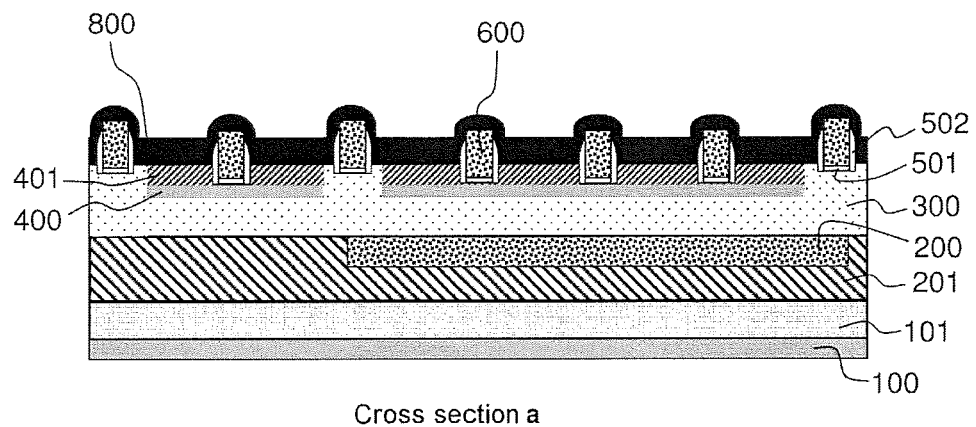
Figure 7C:
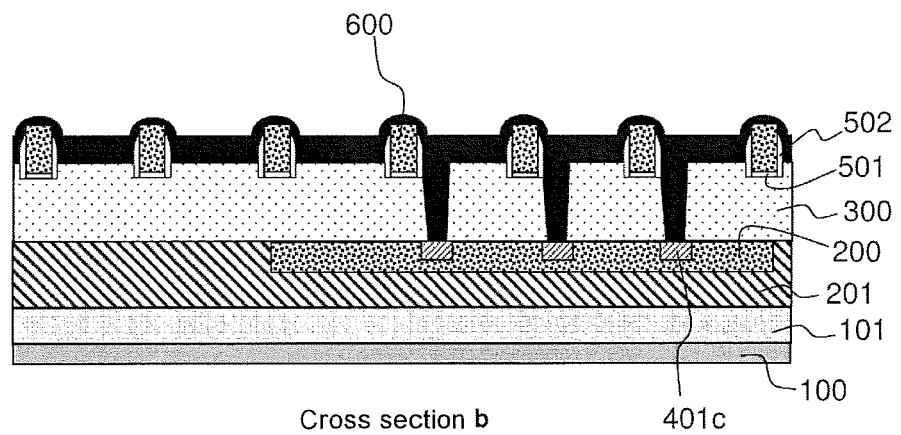

The contact etch stop layer 800, which is possibly made of nitride (CESL) is then deposited as illustrated in FIG. 7c.

Figure 7D:
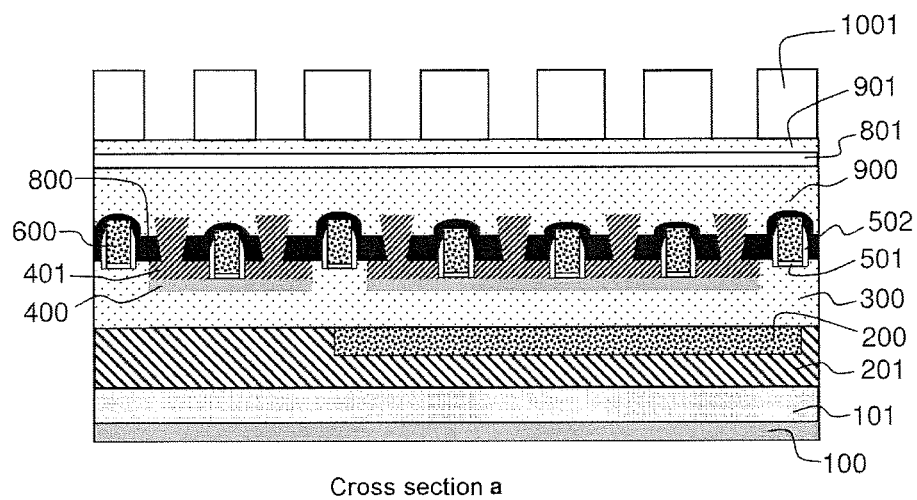
Figure 7D:
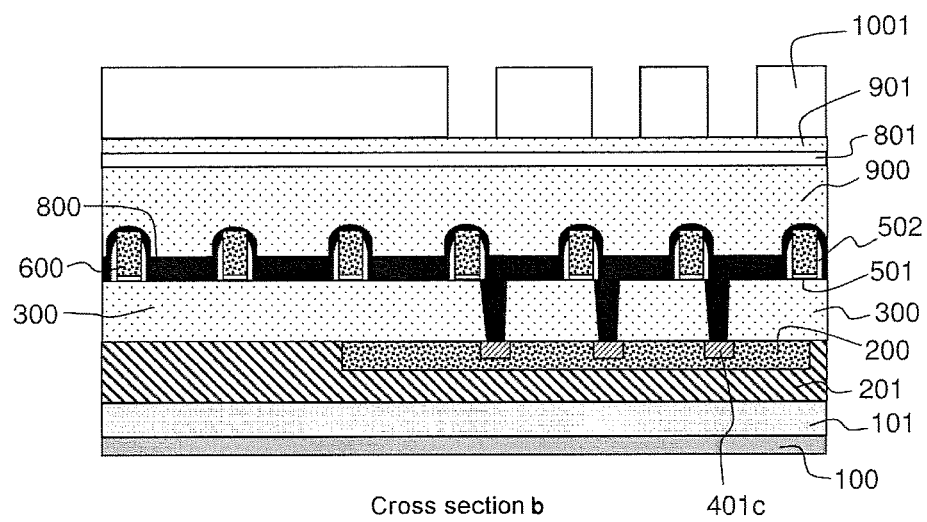

The following deposits are then deposited: a dielectric layer 900, an upper layer defining a hard mask 801 that may possibly be made of nitride, an upper oxide layer 901 and a resist 1001, the formation of these deposits being followed by an operation of etching the resist, as illustrated in FIG. 7d.

Figure 7E:
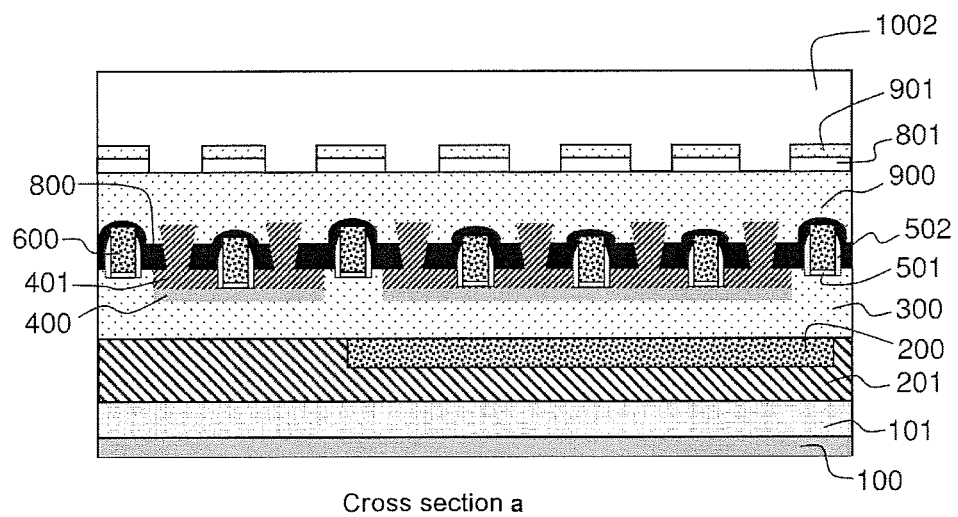
Figure 7E:
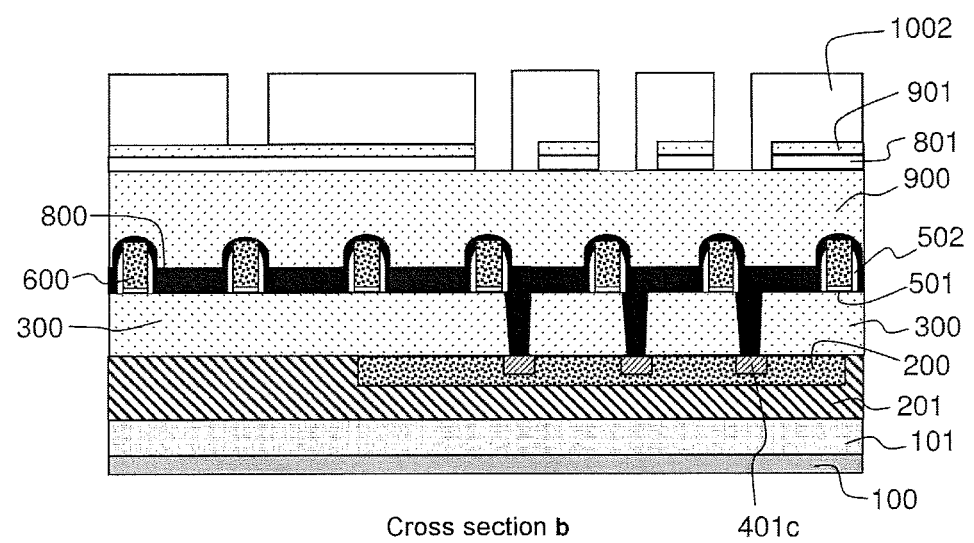

Next, an operation of etching the nitride layer 801 and oxide layer 901 is carried out, then the resist 1001 is etched, this being followed by a new deposition of resist 1002 and an etch of this new resist layer, as illustrated in FIG. 7e.

Figure 7F:
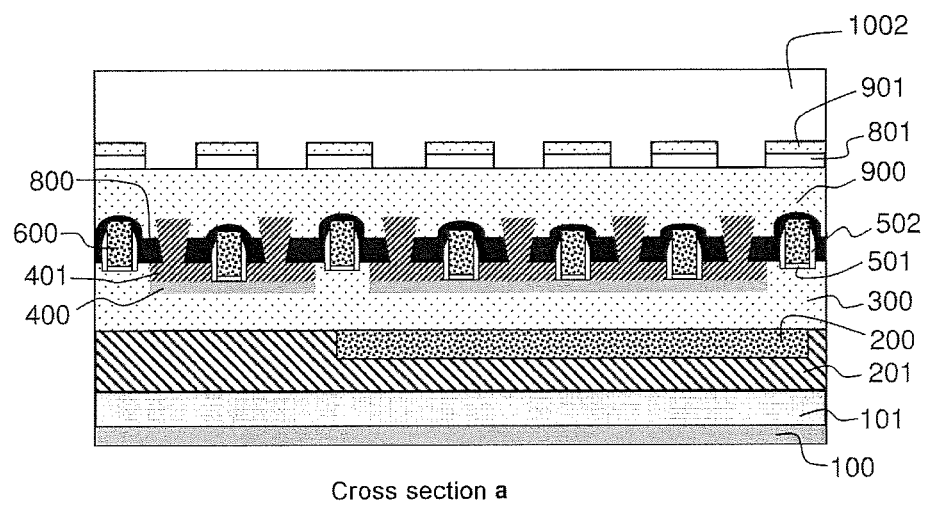

An etching operation is then carried out in the dielectric layer 900, in order to reach an intermediate stage required to define the upper apertures intended for the shared contacts, as illustrated in FIG. 7f.

Figure 7G:
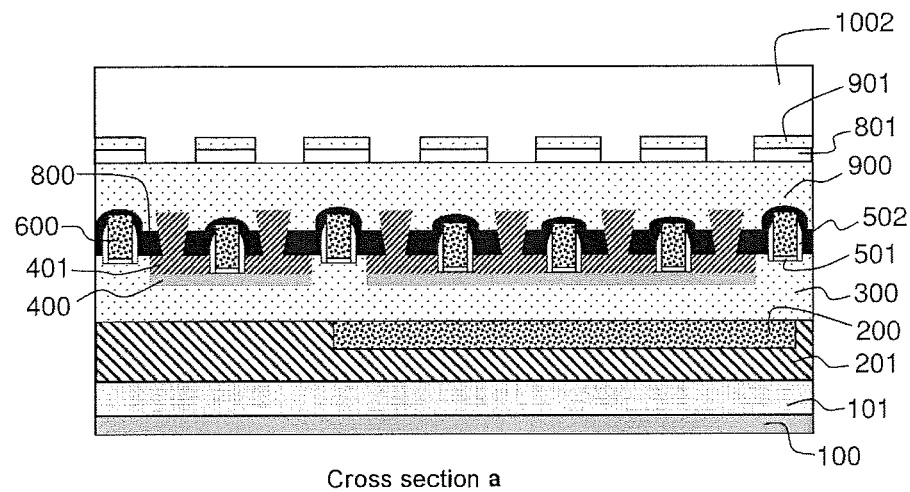
Figure 7G:
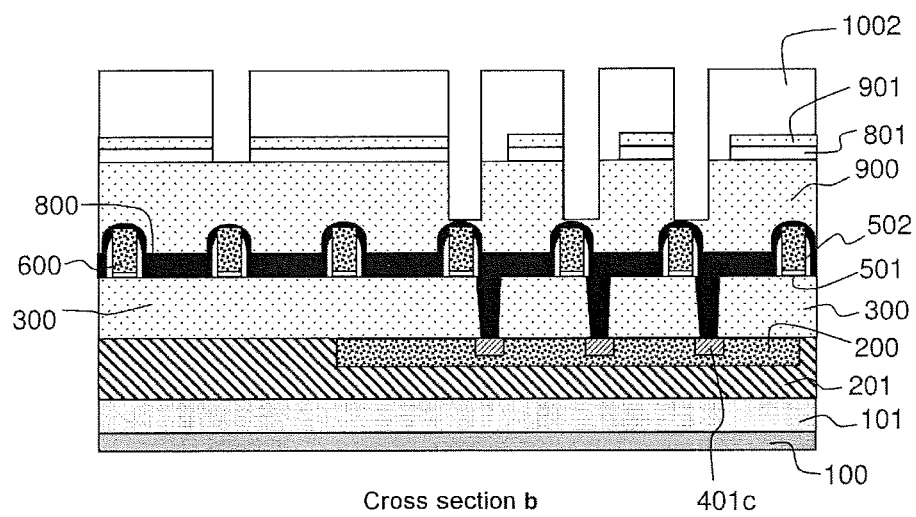

Next an operation of etching the upper nitride layer 801 is carried out as illustrated in FIG. 7g.

Figure 7H:
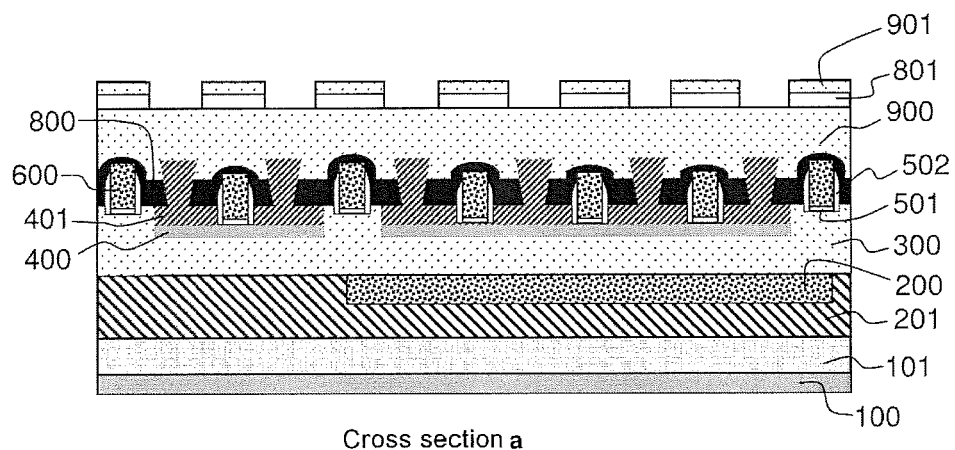
Figure 7H:
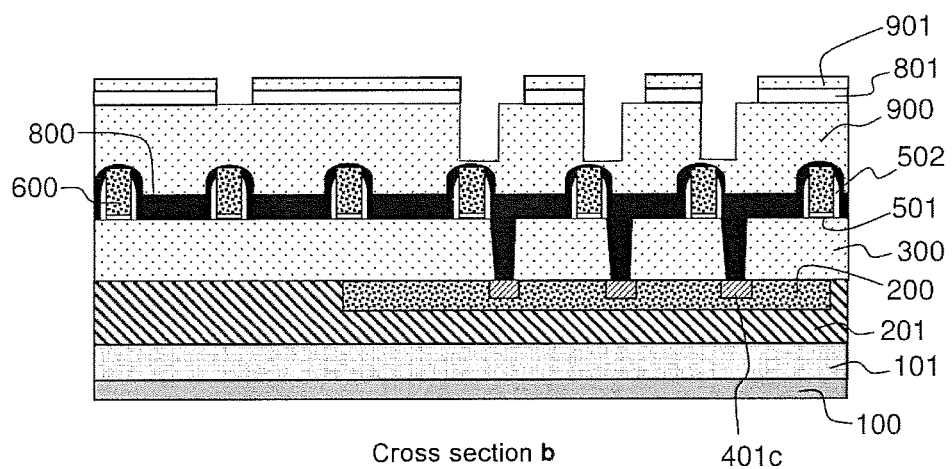

Next a new operation of etching the resist layer 1002 is carried out as illustrated in FIG. 7h.

Figure 7I:
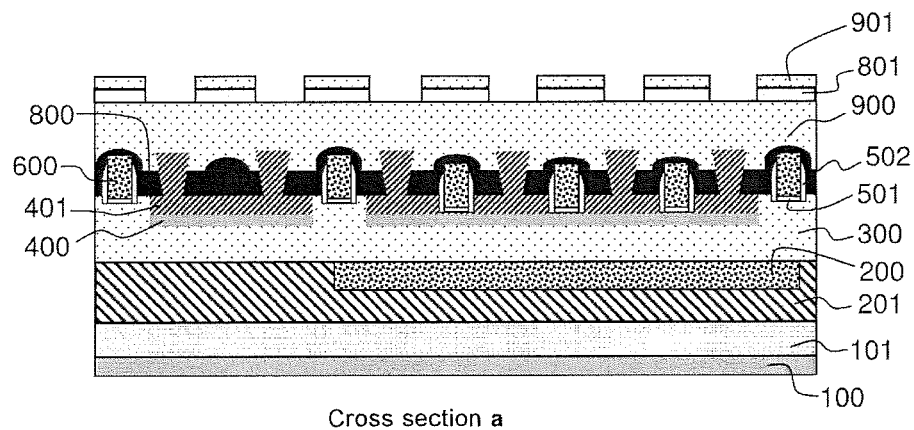
Figure 7I:
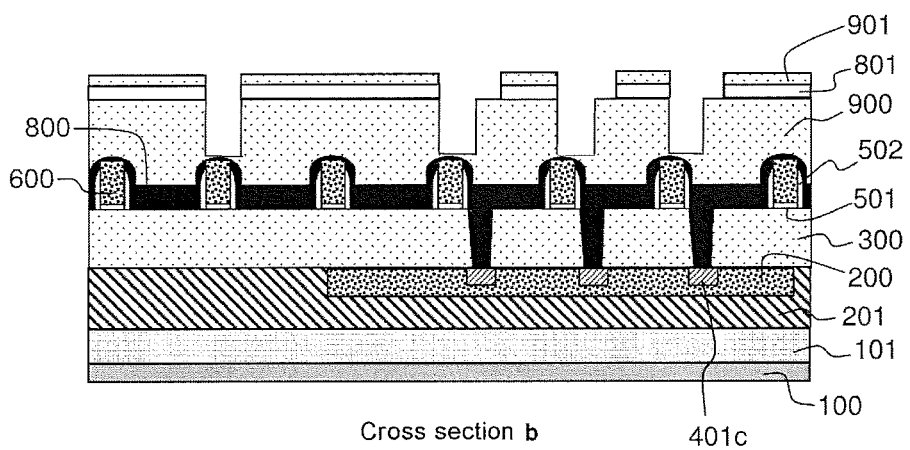

Next an operation of locally etching the dielectric 900 is carried out as illustrated in FIG. 7i

Figure 7J:
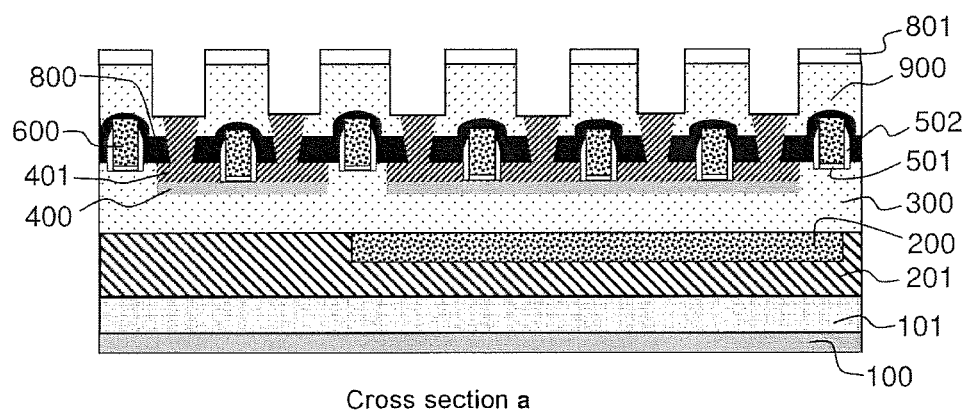
Figure 7J:
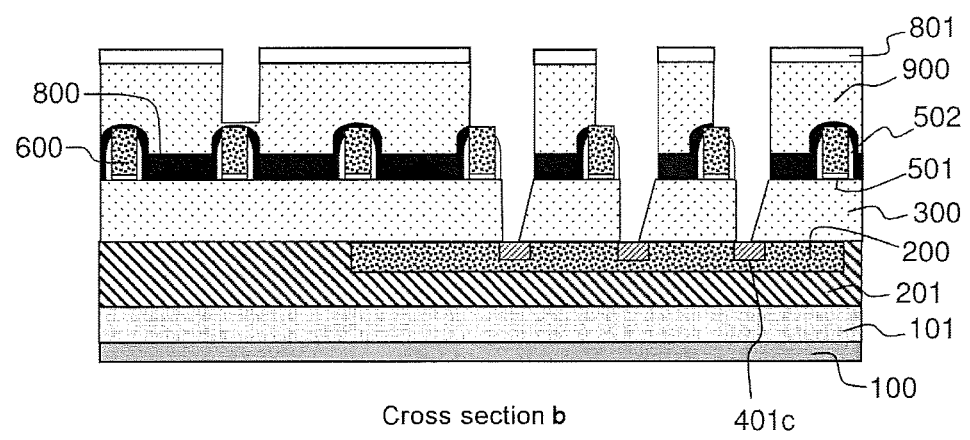

An operation of locally removing the first nitride layer 800 is then carried out to produce the apertures intended for the production of the shared contacts, as illustrated in FIG. 7j

Figure 7K:
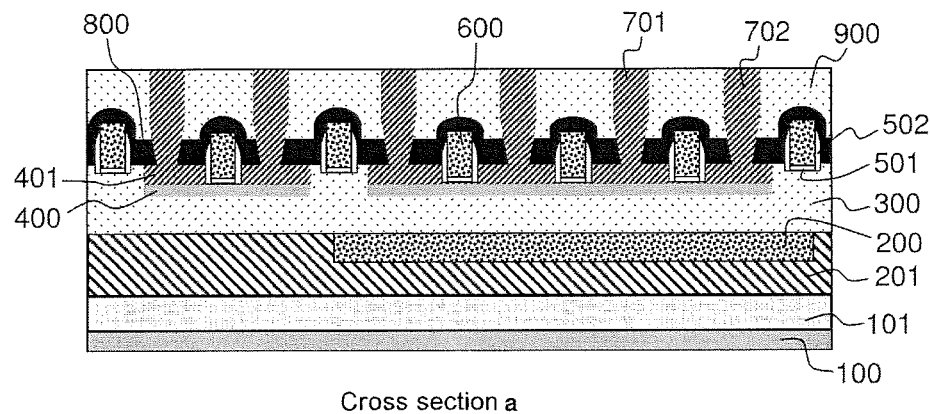
Figure 7K:
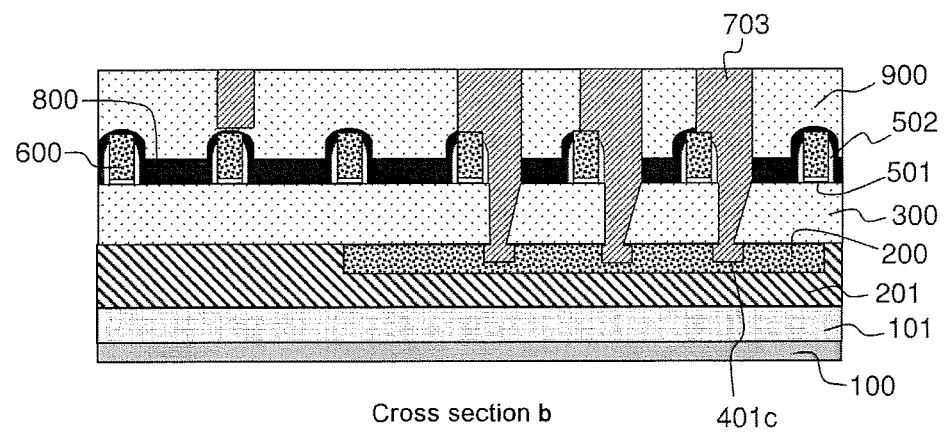

The drain/source contacts 701, 702 and the shared (gate/groundplane comprising connecting elements produced beforehand) contacts 703 are then produced by filling the apertures with a metal, possibly W, as illustrated in FIG. 7k

Third example of a circuit according to the invention, comprising buried groundlines and advantageously able to be integrated into a 3D architecture:

The circuit comprises a set of groundlines 200, facing shared gates as illustrated by virtue of FIGS. 8a to 8e, which show a top view, a cross section a, a cross section b, a cross section 2 and a cross-section 1, respectively.

Figure 8A:
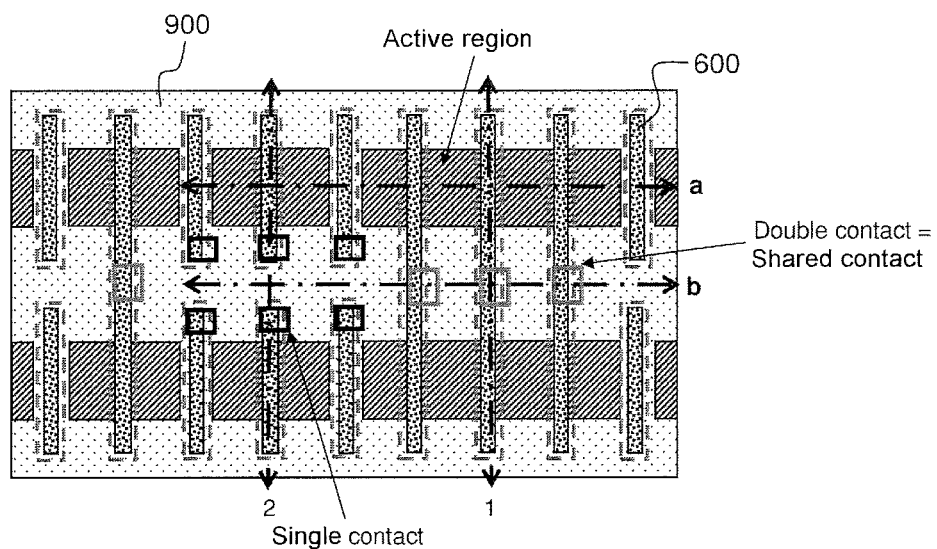
FIGS. 8a to 8e illustrate a fourth example of a set of pMOS and nMOS transistors according to the invention comprising buried groundlines.
Figure 8B:
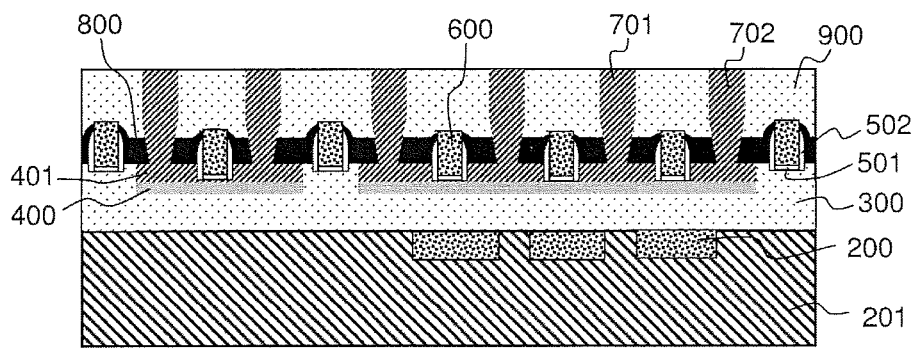
Figure 8C:
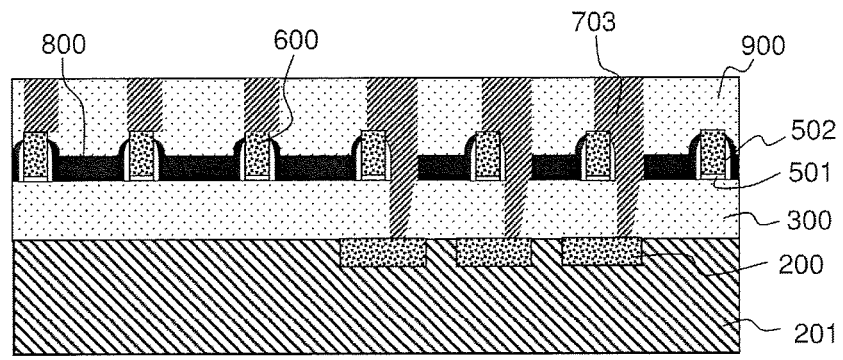
Figure 8D:
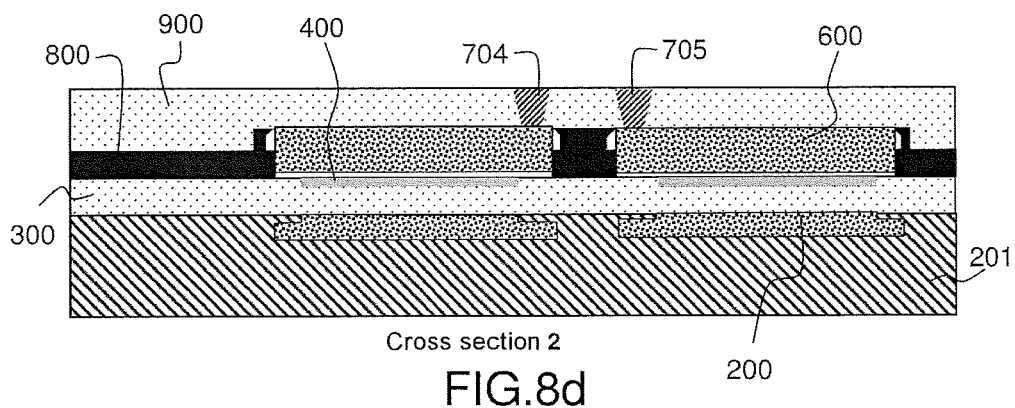
Figure 8E:
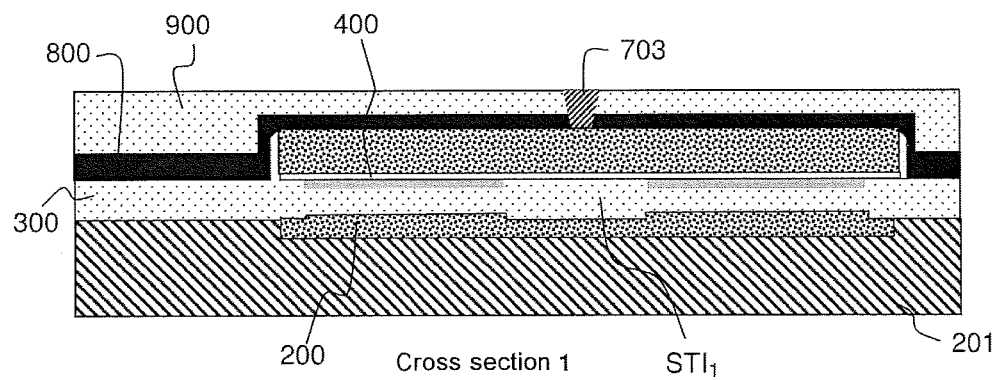

The contacts 704 and 705 correspond to single contacts: gate contacts of nMOS and pMOS transistors in a region other than the active region. FIG. 8c (cross section b) and 8e (cross section 1) allow the contact 703 common to the gate and to the groundplane to be seen. These figures, and in particular FIG. 8e, also show that the integrated circuit comprises a shallow isolation $STI_1$ between the nMOS transistor and the pMOS transistor, said isolation being produced between the two active layers of the transistors, above a continuity of the groundplane.

Example of a process for fabricating a circuit according to the invention including buried groundlines:

It is also possible to produce groundlines buried in a semiconductor, as illustrated in FIGS. 9a to 9e.

Figure 9A:
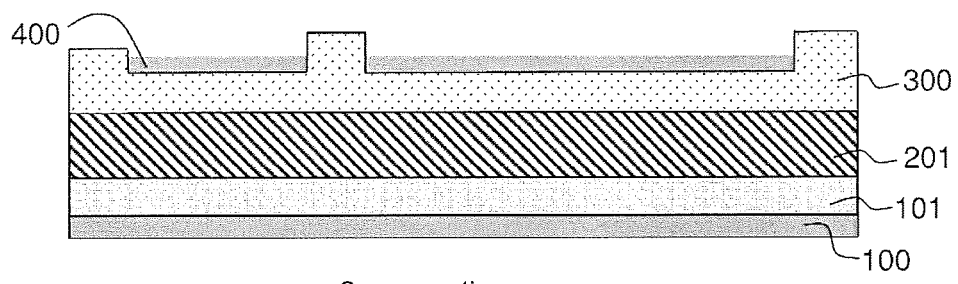
FIGS. 9a to 9e illustrates an example of a process for fabricating an integrated circuit of the invention comprising buried groundlines.
Figure 9A:
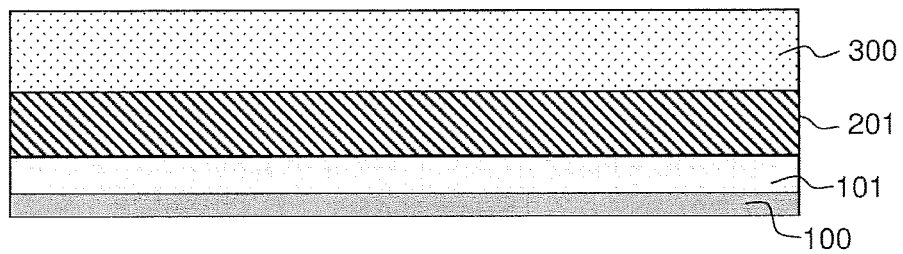

On the surface of a substrate 100, a buried layer 101 (which may be optional) of doped semiconductor, a well 201 made of doped semiconductor and a BOX buried oxide layer 300 are produced under a thin semiconductor layer 400, as illustrated in FIG. 9a.

Figure 9B:
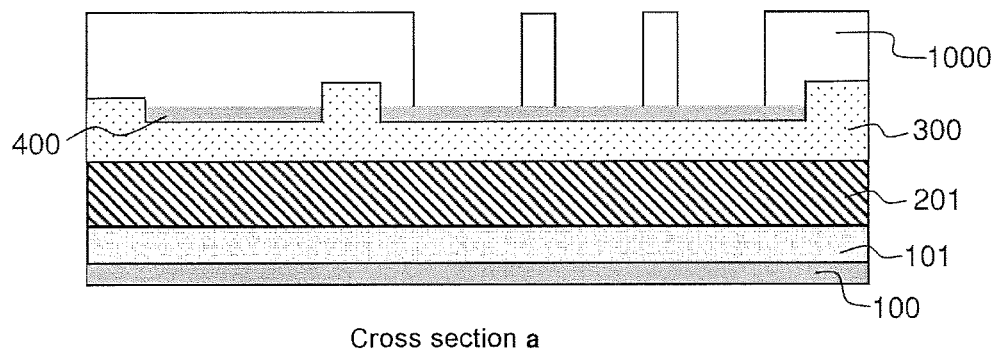
Figure 9B:
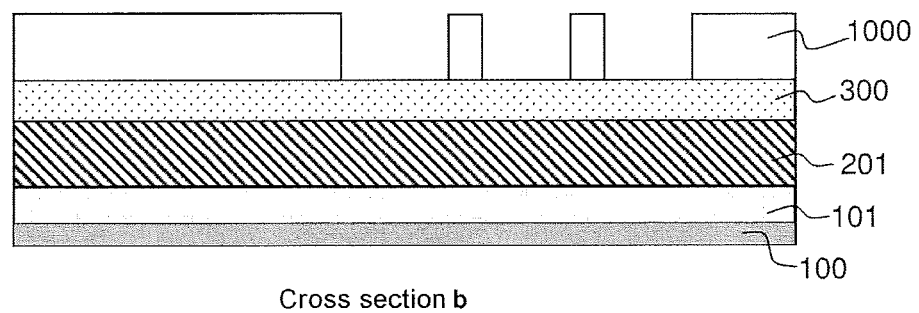

A resist layer 1000 intended to produce an implantation mask is deposited and etched, as illustrated in FIG. 9b.

Figure 9C:
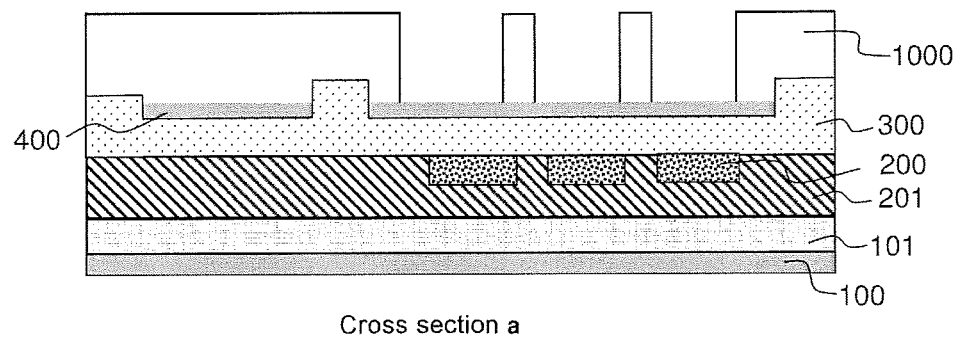
Figure 9C:
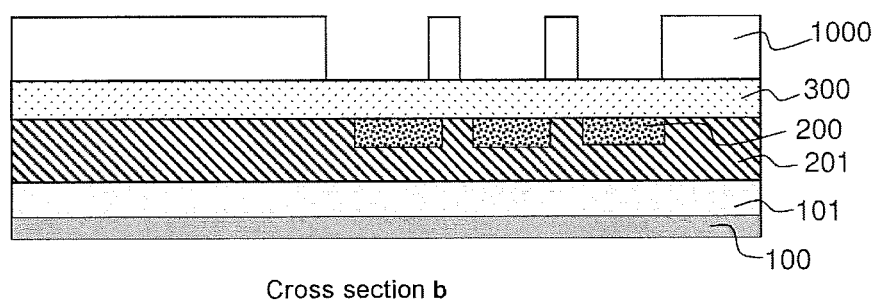

An implantation operation is then carried out in order to define localized groundlines 200, as illustrated in FIG. 9c.

Figure 9D:
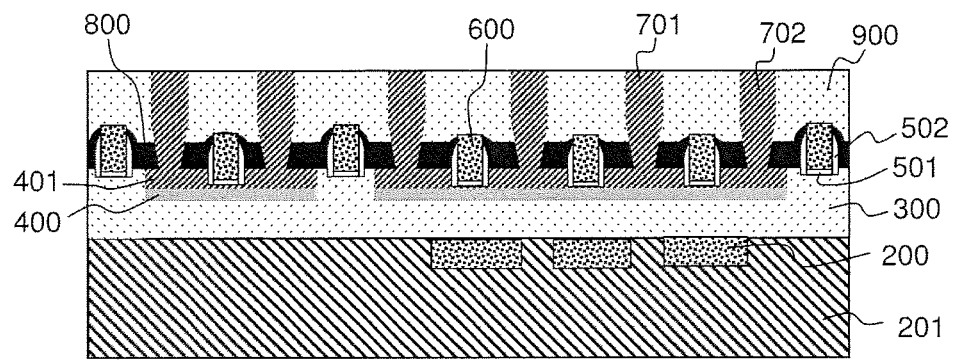
Figure 9D:
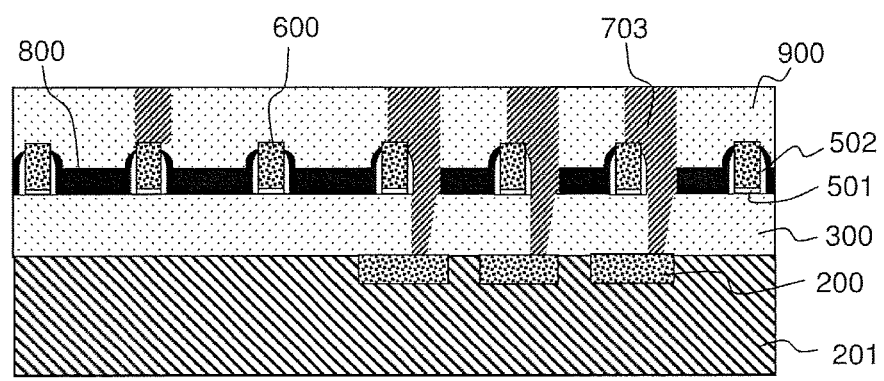

It is then possible to carry out the same steps as those described with reference to the first process for fabricating the first example of a circuit of the invention. Thus, shared contacts 703 that make contact with the buried groundlines 200 are obtained, as illustrated in FIG. 9d

Figure 9E:
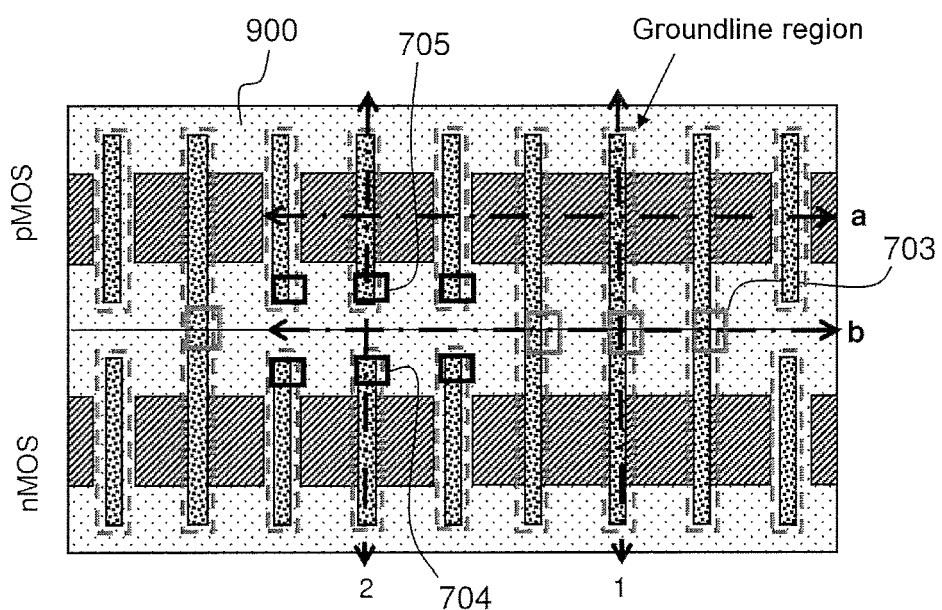

FIG. 9e is a top view depicting all of the regions called active regions comprising contacts shared with buried groundlines.

The circuit of the invention may advantageously comprise a 3D integration of a plurality of nMOS and pMOS transistors with groundlines or groundplanes integrated into dielectrics, possibly oxides (and not integrated into semiconductors with doping levels as described above).

Example of a Process for Fabricating a Circuit According to the Invention Including Buried Groundlines in a 3-D Architecture:

It is also possible to produce buried groundlines in a dielectric as illustrated in FIGS. 10a to 10e, which show various cross sections of examples of 3D architectures.

Figure 10A:
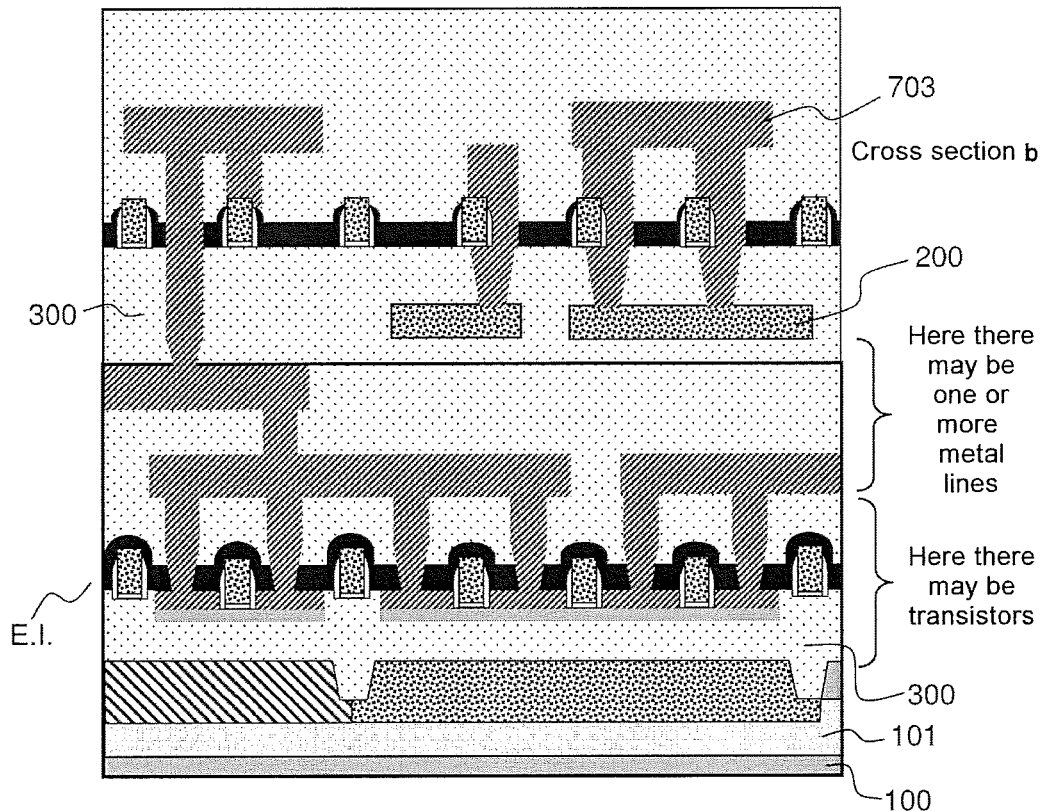
FIGS. 10a to 10e illustrate cross-sectional views of an example of an integrated circuit of the invention including a plurality of levels integrated in 3D.
Figure 10B:
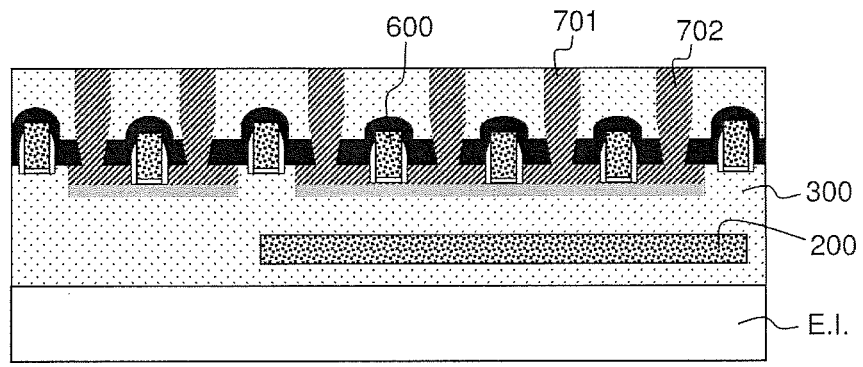
Figure 10C:
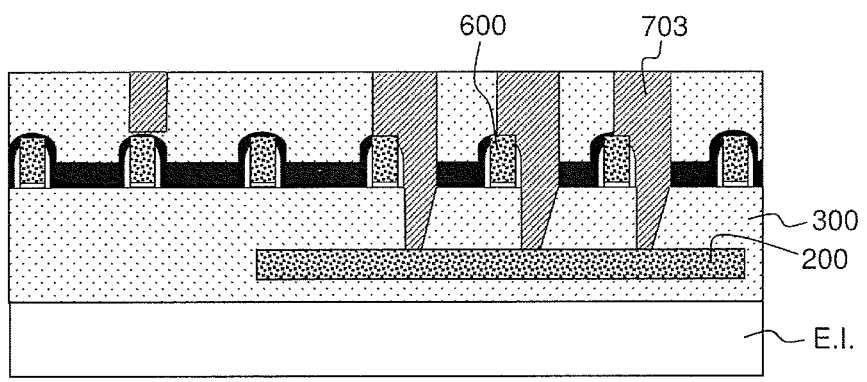
Figure 10D:
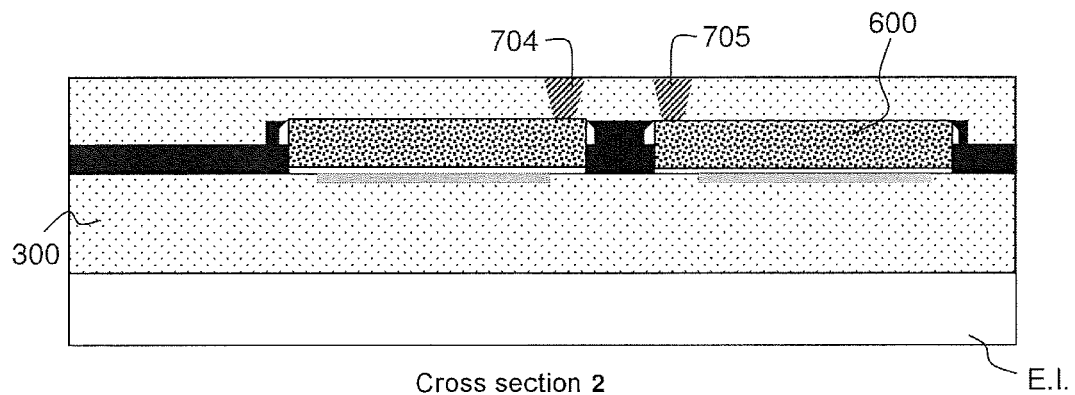
Figure 10E:
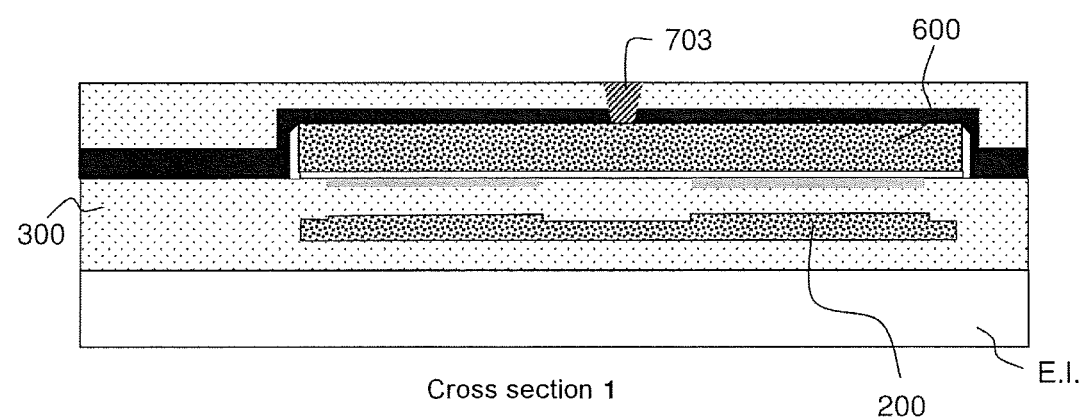

FIG. 10a shows a first example in which a dielectric 300 is located below groundlines 200.

In this example, the lower assembly E.I. includes nMOS and pMOS transistors corresponding to the examples described above. It will be noted that there may be one or more metal lines in the intermediate central level, and that the assembly E.I. could have any other configuration.

To produce this type of configuration, on the surface of a dielectric 300 (optionally covering metal interconnect lines), a doped semiconductor or a metal is deposited. Next a resist layer intended to form a mask is deposited. An etching operation is then carried out in order to define localized groundlines 200 as illustrated in FIG. 10a.

Alternatively, the groundlines may be produced using a Damascene process (known per se), which consists in producing cavities in the dielectric, in depositing the metal non-selectively, then in carrying out a chemical-mechanical planarizing operation in order to remove the metal from the exterior of the cavities. It is then possible to deposit a dielectric and a semiconductor layer (for example of Si), for example by wafer bonding, as described in 3-D sequential integration (Brunet et al, VLSI'17).

It is then possible to carry out the same steps as those described with reference to the first process for fabricating the first example of a circuit of the invention. Thus, shared contacts 703, which make contact with the buried groundlines 200, are obtained.

FIGS. 10b to 10e show various cross sections a, b, 2 and 1 (relative to the same cross sections as those of the preceding figures) of another example of a 3D configuration with a groundplane in the dielectric 300, the lower portion E.I. possibly being identical to that illustrated in FIG. 10a.

Figure 11:
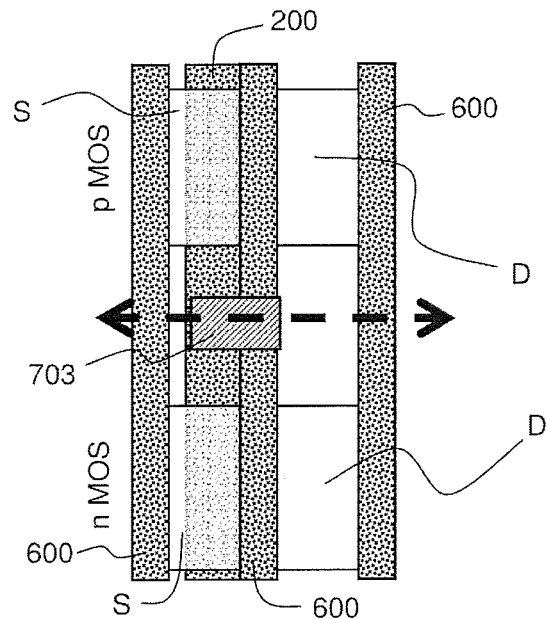
FIG. 11 illustrates an example of a set of nMOS and pMOS transistors in an integrated circuit according to the invention comprising a groundline that is off-centered with respect to the gate so as not to protrude drain-side.

Fourth Example of a Circuit According to the Invention Comprising Off-Centered Buried Groundlines It may be particularly advantageous to define a configuration in which the buried groundlines do not protrude (in vertical projection) with respect to the front gates on the drain-side of the nMOS and pMOS transistors, as illustrated in FIG. 11, which depicts a pMOS transistor and an nMOS transistor, with the sources of the transistors referenced S and the drains of the transistors referenced D. A common groundline 200 is positioned facing the central gate 600 in such a way as to be off-centered to the source side, and thus not to protrude drain-side.

The fact of making it so that the groundline does not protrude on the side of the drains of the transistors makes it possible to decrease the parasitic capacitance between the groundline and the drain and therefore to improve dynamic circuit performance.

Drain-side protrusions penalize dynamic performance more then source-side protrusions.

Advantageously, it is therefore preferred for the groundline not protrude drain-side.

Figure 12:
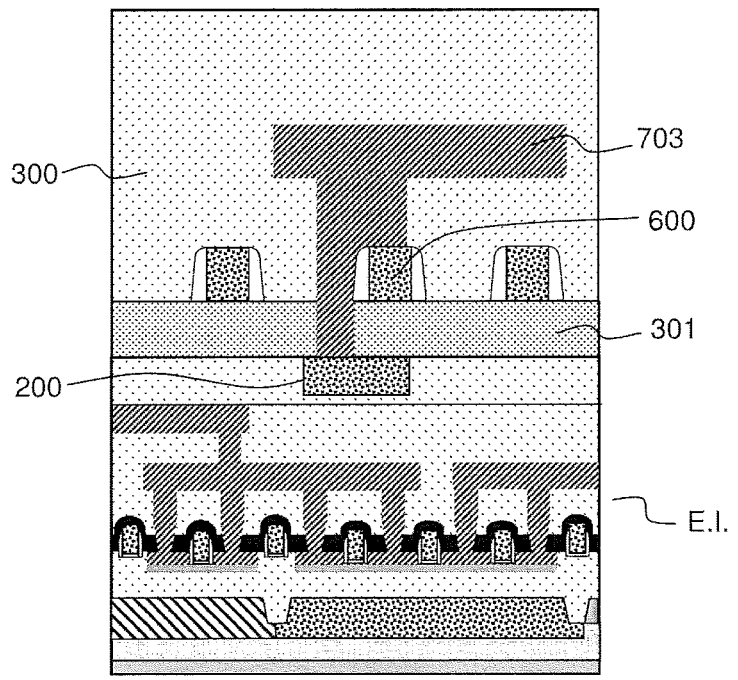
FIG. 12 illustrates a cross-sectional view of an example of an integrated circuit of the invention comprising a groundline that is off-centered with respect to the gate so as not to protrude drain-side

In a 3D architecture having a lower portion E.I. such as mentioned above it is also possible to produce this type of configuration having off-centered groundlines that do not protrude (in vertical projection) with respect to the front gates on the drain-side of the nMOS and pMOS transistors, as illustrated in FIG. 12, which depicts the shared contact 703 and the groundline 200, which is located below an insulating layer 301 and is off-centered with respect to the upper gate 600.

Fifth Example of a Circuit According to the Invention Comprising Common Sources Between Two Adjacent Transistors:

In this example, the circuit of the invention comprises a common source between two adjacent nMOS transistors and a common source between two adjacent pMOS transistors.

Figure 13:
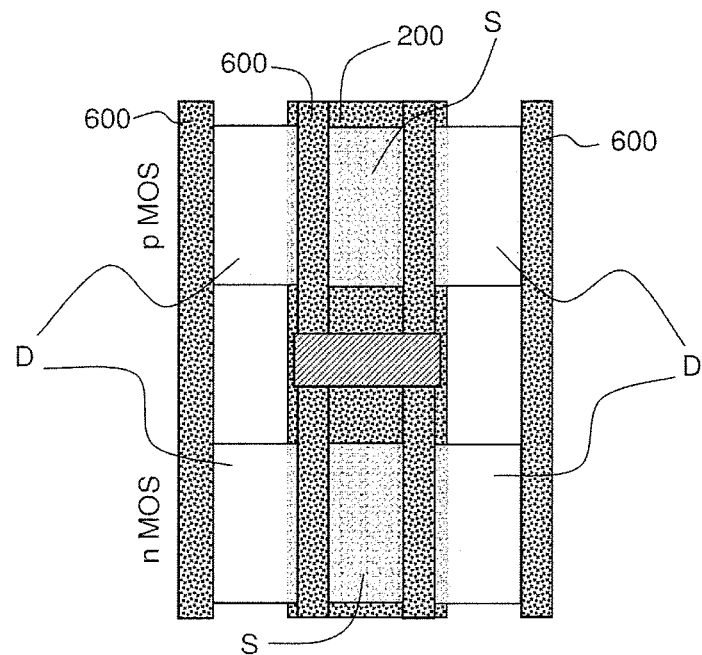
FIG. 13 illustrates an example of a set of transistors in an integrated circuit of the invention comprising a source that is shared between two adjacent transistors of the same type.

FIG. 13 illustrates a configuration advantageously having a central common source S between 2 transistors of the same type and a groundline 200 that is superposed (in vertical projection) with the front gate 600 and with the source S common to two adjacent transistors of the same type. The drains D are shown on either side of the central sources S.

Figure 14:
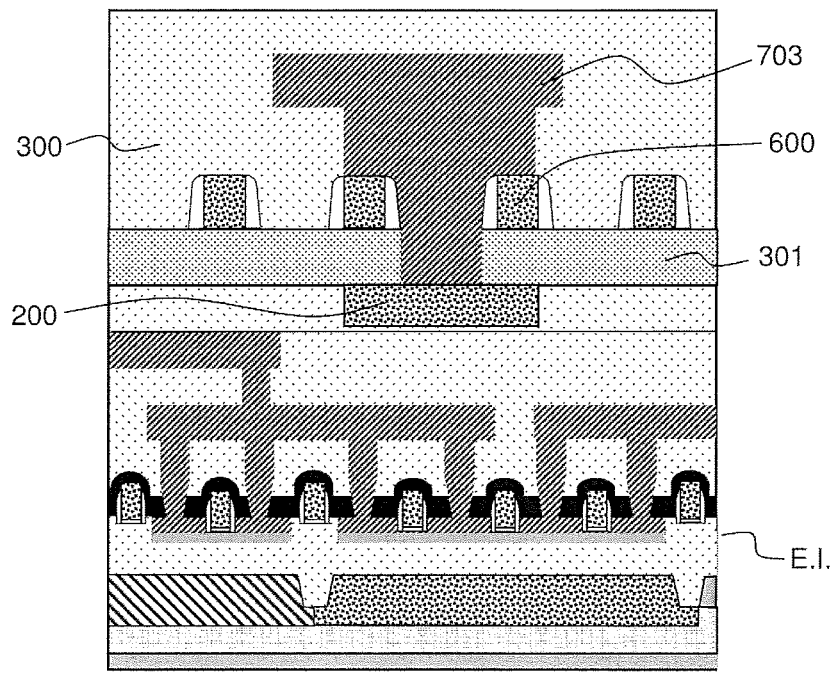
FIG. 14 illustrates a cross-sectional view of an example of an integrated circuit of the invention comprising a source that is shared between two adjacent transistors of the same type.

In a 3D architecture having a lower portion E.I such as mentioned above it is also possible to produce this type of configuration having an off-centered groundline that does not protrude (in vertical projection) with respect to the front gates on the drain-side of the nMOS and pMOS transistors and a source shared between two transistors of the same type, as illustrated in FIG. 14, which depicts the shared contact 703 making contact with the groundline 200, which is located below an insulating layer 301 and the front gate 600.

The invention claimed is:

1. An integrated circuit comprising:
   a substrate;
   a buried insulating layer;
   at least one nMOS transistor comprising a semiconductor layer placed above said buried insulating layer;
   at least one pMOS transistor comprising a semiconductor layer placed above said buried insulating layer;
   at least one semiconductor groundplane that may be doped or a metal groundplane, placed above the substrate and below the buried insulating layer, said buried plane being common to said nMOS transistor and to said pMOS transistor;
   at least one gate insulator and a gate that is common to said nMOS transistor and to said pMOS transistor and that is located above channels of these transistors and facing said groundplane, the area of the groundplane at least covering the area of the gate in vertical projection;
   said nMOS transistor being separated from said pMOS transistor by an isolation defined between said semiconductor layer of said nMOS transistor and said semiconductor layer of said pMOS transistor, said isolation being located in said buried insulating layer and making contact with said groundplane;
   at least one shared contact making electrical contact with said common gate and with said common groundplane, said shared contact passing through the buried insulating layer or said isolation;
   at least one deep isolation region having a lower limit lower than the lower limit of said groundplane on the periphery of said groundplane or of said groundlines, the region located between at least the nMOS transistor and at least the pMOS transistor comprising a shallow isolation region, with a lower limit that is less low than the lower limit of said groundplane or of groundlines.

2. The integrated circuit according to claim 1, wherein said shared contact is located between said nMOS transistor and said pMOS transistor.

3. The integrated circuit according to claim 1, wherein the groundplane is defined in a doped semiconductor region referred to as a well, of opposite type to that of said groundplane, said groundplane being doped semiconductor.

4. The integrated circuit according to claim 1, comprising a plurality of nMOS transistors and a plurality of pMOS transistors, said circuit comprising a groundplane common to said plurality of pMOS transistors and to said plurality of nMOS transistors or a plurality of common groundlines between an nMOS transistor and a pMOS transistor, said groundlines facing said common gates and being separated by a dielectric.

5. The integrated circuit according to claim 4, comprising groundlines that do not protrude in vertical projection with respect to said gates of said nMOS and pMOS transistors on the side of drains of said nMOS and pMOS transistors.

6. The integrated circuit according to claim 5, comprising groundlines that are off-centered on the side of sources of said transistors with respect to said gates of said nMOS and pMOS transistors so as not to be facing the drains of said nMOS and pMOS transistors.

7. The integrated circuit according to claim 1, comprising at least two adjacent nMOS transistors and at least two adjacent pMOS transistors, said adjacent nMOS transistors and said adjacent pMOS transistors having a common source between transistors of the same type and a common groundline that is superposed in vertical projection with the gates of said nMOS and pMOS transistors and with the common source.

8. The integrated circuit according to claim 4, wherein, the shared contact comprises a contact integrated into at least said groundplane or contacts integrated into said groundlines, made of tungsten or of copper.

9. The integrated circuit according to claim 1, comprising a dielectric, an oxide, located below said groundplane.

10. The integrated circuit according to claim 9, comprising at least one lower level comprising at least one transistor located below said dielectric located below said groundplane, so as to form a 3D architecture.

11. The integrated circuit according to claim 9, wherein said groundplane covers all of the common gate and a portion of sources or of drains of said transistors.

12. A process for fabricating an integrated circuit according to claim 1, comprising:
producing sources, drains and gates of one or more nMOS transistors and of one or more pMOS transistors;
producing at least one buried groundplane or buried groundlines above the substrate;
producing source and drain contacts of at least the nMOS transistor and of at least the pMOS transistor;
producing one or more shared contacts for making contact with the gates and the groundplane or with the gates and the groundlines.

13. The process for fabricating according to claim 12, wherein the production of the sources, drains and gates of the transistors is followed by:
depositing a contact etch stop layer, made of nitride, on the surface of said sources, drains and gates, and an oxide dielectric layer;
producing the source and drain contacts;
successively depositing at least: one contact etch stop layer, made of nitride, one oxide layer, and one resist layer;
carrying out operations of etching said deposited layers in order to define one or more shared-contact apertures that open onto at least one portion of said gates and onto the groundplane or shared-contact apertures that open onto at least one portion of said gates and of the groundlines;
filling said one or more apertures with at least one electrical conductor in order to define said one or more shared contacts.

14. The process for fabricating an integrated circuit according to claim 13, comprising:
producing the sources, drains and gates of the nMOS and pMOS transistors producing one or more contacts integrated into said groundplane or into said groundlines and one or more primary apertures in the buried insulating layer above said one or more groundplane-integrated contacts;
depositing a layer above the sources, drains and gates in said primary aperture;
producing the source and drain contacts;
producing one or more shared contacts on the surface of said one or more integrated contacts.

15. The process for fabricating according to claim 14, comprising the following steps:
successively depositing at least: one contact etch stop layer, possibly made of nitride, one oxide layer, and one resist layer;
carrying out operations of etching said deposited layers in order to define at least one shared-contact aperture that opens onto at least one portion of said gate and onto the groundplane or shared-contact apertures that open onto the gates and onto the groundlines;
filling said one or more apertures with at least one electrical conductor in order to define the one or more shared contacts.

16. The process for fabricating according to claim 14, comprising:
producing a groundplane or groundlines by implantation through a mask on the surface of the active semiconductor layers of the nMOS and pMOS transistors, followed by the steps of:
producing the sources, drains and gates of at least the nMOS transistor and of at least the pMOS transistor;
producing the source and drain contacts of at least the nMOS transistor and of the pMOS transistor;
producing the shared contacts in order to contact the gate and the groundplane or the gates and the groundlines.

17. The process for fabricating according to claim 12, comprising producing a buried dielectric layer located below said groundplane.

18. An integrated circuit comprising:
a substrate;
a buried insulating layer;
at least one nMOS transistor comprising a semiconductor layer placed above said buried insulating layer;
at least one pMOS transistor comprising a semiconductor layer placed above said buried insulating layer;
at least one semiconductor groundplane that may be doped or a metal groundplane, placed above the substrate and below the buried insulating layer, said buried plane being common to said nMOS transistor and to said pMOS transistor;
at least one gate insulator and a gate that is common to said nMOS transistor and to said pMOS transistor and that is located above channels of these transistors and facing said groundplane, the area of the groundplane at least covering the area of the gate in vertical projection;
said nMOS transistor being separated from said pMOS transistor by an isolation defined between said semiconductor layer of said nMOS transistor and said semiconductor layer of said pMOS transistor, said isolation being located in said buried insulating layer and making contact with said groundplane;
at least one shared contact making electrical contact with said common gate and with said common groundplane, said shared contact passing through the buried insulating layer or said isolation, said shared contact being asymmetric with respect to said common gate.

19. The integrated circuit according to claim 18, comprising at least one lower level comprising at least one transistor located below said dielectric located below said groundplane, so as to form a 3D architecture.

* * * * *